United States Patent [19]

McCarthy et al.

[11] 3,913,021

[45] Oct. 14, 1975

[54] HIGH RESOLUTION DIGITALLY PROGRAMMABLE ELECTRONIC DELAY FOR MULTI-CHANNEL OPERATION

[75] Inventors: William F. McCarthy, Wappingers Falls; Phillip R. Myers, Fishkill, both of N.Y.

[73] Assignee: International Business Machines Corporation, Armonk, N.Y.

[22] Filed: Apr. 29, 1974

[21] Appl. No.: 465,029

[52] U.S. Cl. .................. 328/62; 307/260; 307/269; 307/293; 328/129; 331/1 A; 331/18; 331/25

[51] Int. Cl.$^2$ ....................... H03K 5/13; H03B 3/04

[58] Field of Search ........... 307/208, 269, 293, 260; 328/62, 63, 55, 72, 74, 155, 129; 331/1 A, 18, 25

[56] References Cited

UNITED STATES PATENTS

| | | | |
|---|---|---|---|
| 3,437,938 | 4/1969 | Krygowski | 307/269 |
| 3,590,280 | 6/1971 | Hudson et al. | 328/62 |
| 3,602,834 | 8/1971 | McAuliffe | 307/269 |
| 3,619,793 | 11/1971 | Broome et al. | 328/62 |
| 3,633,113 | 1/1972 | Grubel et al. | 307/269 |
| 3,813,610 | 5/1974 | Kimura | 331/1 A |
| 3,824,483 | 7/1974 | Margala et al. | 331/25 |

*Primary Examiner*—Stanley D. Miller, Jr.
*Attorney, Agent, or Firm*—Wesley DeBruin

[57] ABSTRACT

A digitally programmable electronic delay may be achieved by counting pulses of a stable clock and providing an output signal when a prescribed count is reached. This is done with a synchronous counter and an Exclusive OR matching circuit. The resolution of this delay is limited by the smallest clock period that can be counted, a speed limit of the logic blocks used.

Two programmable delays with different clock periods are employed such that a total delay of any combination of the two periods can be programmed. The smallest interval being the difference between the two periods. One of the clocks is a stable reference and the other is controllable. Both clock rates are divided down to a common frequency and these signals are compared in a phase detector. The output of the phase detector is fed back to the controllable clock so that the relative time position of the two clocks is held constant.

The Electronic delay apparatus or timer employs a Read Only Memory (ROM) for selecting the time interval or delay. For example, in the illustrative embodiment set forth in detail hereinafter, a pulse may be delayed any integer number of nanoseconds. Correspondingly, a pulse may be provided at any integer number of nanoseconds with respect to a reference time. When the digital input word is increased, each counter produces an output at the time when the value of the counter (clock periods of delay) is equal to the respective binary data programmed into it. This will cause T delay to increase relative to T reference. T delay then, will be equal to the number of $T_1$ clock periods plus the number of $T_2$ clock periods added together. T reference will repeat every cycle at the same point in time, regardless of the programmed delay value.

19 Claims, 28 Drawing Figures

ROM CIRCUITRY WITH TTL TO
MECL LEVEL CONVERSION (CIRCUITRY FOR DIVIDER 28 COUNTER 29
AND COMPARATOR 30
FIG. 2)

CIRCUIT FOR CLOCK 21 COUNTER 24 AND COMPARATOR 25 FIG. 2

* FOR ALL EXAMPLES
** FOR ZERO DELAY

HIGH RESOLUTION DIGITALLY PROGRAMMABLE ELECTRONIC DELAY FOR MULTI-CHANNEL OPERATION

BACKGROUND OF THE INVENTION AND PRIOR ART

Numerous electronic timer and electronic delay techniques and apparatus are known to the art.

In the field of precision timing and precise measurements, it is desirable to maintain a reliable reference for calibration of test equipment. In this area, there are various types of time-measuring instruments for measuring time-delay circuits, the occurrence of events, the accuracy of a time delay line and the like. One prior art technique is to generate pulses with such precise time intervals that they can be used for reference in calibrating time measuring instruments. Also, the time interval generator with associated equipment can be employed to measure precisely the time interval of an unknown time event.

The precision pulse generator of the prior art may be considered to be digital in nature in that it involves no smoothly varying quantity which marks a time interval by amplitude coincidence with a reference. Rather, a system of gates and logic circuits chooses appropriate pulses to define the time interval. Such systems usually have the disadvantage of allowing only discrete fixed intervals to be generated. The present invention avoids this by providing a continuously variable pulse period. Certain precision pulse generators of the prior art provide time intervals from 25 to 140 microseconds and by modification, the range can be extended down to 2.5 or up to 1000 microseconds. As with most digital devices, precision is largely independent of time setting.

A time interval, however precise, is unusable to other electronic equipment unless adequately defined. The precision apparatus of applicants' High Resolution Digitally Programmable Electronic Delay provides a time reference and precisely timed and shaped pulses. The time occurrence with respect to said time reference, of these precisely timed and shaped pulses may be selected by digitally addressing a Read Only Memory (ROM). The time interval selected may be any integer number of nanoseconds. By modification, which will be fully apparent to those skilled in the art, the interval of applicants' invention may be any non integer number of nanoseconds. Namely, the time interval selected may be any integer number of time increments, where each time increment is a predetermined fractional portion of a nanosecond.

Certain prior art methods of measuring time intervals employ a means for generating a series of accurately spaced time marks which can be initiated by a phenomena which occurs more or less at random. In these systems, the time marks are displayed on an oscilloscope and the time interval must occur within the sweep frequency of the oscilloscope. The time interval to be measured initiates the time marks and the end of the time interval falls on or near one of the time marks. This means that if the second pulse ending the time interval falls between any two time marks, the time interval is calibrated approximation. It can be seen that this method cannot be employed if the time interval is greater than the sweep frequency of the oscilloscope.

Another prior art method of measuring a time interval is employed in radar where a transmitted pulse initiates the time interval which is displayed on an oscilloscope. The transmitted and received pulses can be employed to initiate a variable delay range indicator circuit that can be adjusted to equal the time interval between the transmitted and received pulse. This time interval is then read out on a calibrated dial. Here, the accuracy is dependent upon the close calibration of the dial.

Still another prior art method of measuring time intervals employs a known frequency and a means of counting the pulses generated by the frequency during the time interval.

A time interval generator known to the prior art employs two oscillators. One having a variable frequency output and the other a fixed frequency output. A frequency divider is connected to the variable oscillator for dividing its frequency by a selected factor. A counter is used for counting the periods of the fixed oscillator occurring during a cycle of the divided frequency of the variable oscillator. This defines the period of the variable oscillator in terms of that of the fixed oscillator. A circuit is provided for selecting as a time interval a predetermined number of periods of the variable oscillator. A trigger circuit instigates the occurrence of a first pulse at the start of the time interval and also instigates a second pulse marking the end of the time interval.

Prior art pulse sources and frequency synthesizers have employed phase locked oscillators. In apparatus for providing regularly recurring signals for timing purposes, one prior art technique is to employ first and second phase locked sources or pulse generators. In a prior art precision radio frequency signal generator, an output from a controlled phase locked frequency synthesizer loop is mixed with an output from a tunable phase locked variable frequency oscillator loop to provide a range of accurate frequency R.F. signals.

The prior art discloses time - amplitude converters which measure the time interval as defined by an initial pulse and a final pulse. The converters are so designed that, each time two such pulses are applied thereto; said converters accordingly produce a third pulse having an amplitude which is proportional to the time interval to which said two pulses correspond.

In the prior art, apparatus is provided for counting and sorting the time interval separating events A and of a first kind from events B of a second kind which are related with said events of said first kind. In order to obtain this result, these events are transformed into corresponding electrical pulses *a* and *b*. Pulse *a* being taken as origin, time is divided into consecutive short intervals D*t* which constitute time bands, and the number of pulses *b* occurring in every time band is counted. Generally, a selector is capable of working with several band widths. In some apparatus, events B are recorded only after a given time has elapsed since the corresponding event A.

A time recovery circuit based on the departure from the zero crossing of an analog signal is disclosed and claimed in U.S. Pat. No. 3,602,834, granted Aug. 31, 1971, to Gerald K. McAulliffe and of common assignee herewith.

A waveform transient measuring circuit comprising two transmission lines and a plurality of spaced coincidence detectors connecting the two lines is disclosed and claimed in U.S. Pat. No. 3,688,194, granted Aug.

29, 1972, to Philippe C. Furois, and of common assignee herewith.

A system for generating a pulse train whose constituent pulses occur synchronously with a reference transition of a high-frequency oscillator, which may be easily extended to a system for generating a plurality of such pulse trains and includes a frequency divider circuit for generating pulses whose frequency is a percentage of the frequency of the oscillator, a delay circuit for delaying the pulse output of the frequency divider circuit, and a gated pulse generator for generating the constituent pulses of the pulse train whenever enabled by the output from the delay circuit and triggered by the reference transition. The above system is disclosed and claimed in U.S. Pat. No. 3,633,113, granted Jan. 4, 1972, to Stanley J. Grubel and John F. Merrill and of common assignee herewith.

A second order digital phase-lock loop is disclosed and claimed in U.S. Pat. No. 3,646,454, granted Feb. 29, 1972, to Issac Horowitz, Lowrence A. Laurich, and Fred W. Niccone, and of common assignee herewith.

SUMMARY OF THE INVENTION

This invention is directed to a High Resolution Digitally Programmable Electronic Delay.

A digitally programmable electronic delay may be achieved by counting pulses of a stable clock and providing an output signal when a prescribed count is reached. This may be accomplished with a synchronous counter and an EXCLUSIVE OR matching circuit. The resolution of a delay of this type is limited by the smallest period that can be counted, a speed limit of the logic blocks used.

One embodiment of applicants' invention employs two programmable delays, each having a different clock period, such that a total delay of any combination of the two clock periods may be programmed. The smallest time delay, or time interval, being the time difference between the two clock periods. A unique feature of applicants' invention is the method and apparatus by which the two clocks are synchronized. One of the clocks is a stable reference. The second clock is controllable. A voltage controlled oscillator (VCO) may be employed as the second clock. The outputs of the two clocks are respectively divided down to a common frequency and are compared. The output of the comparator is employed to control the second clock. The comparator may be a phase detector with the output thereof fed back to a VCO so that the relative time position of the two clocks is held constant.

If the period of one clock is $T_1$ and the period of the second clock is $T_2$, the smallest difference that is programmable is $T_2 - T_1$. In order to have the same frequencies into the comparator, or phase detector, each clock frequency must be divided down to a common frequency. Where the frequencies of the clocks are $f_1$ and $f_2$ respectively, the following condition must be satisfied:

$$\frac{f_1}{M} = \frac{f_2}{N}$$

Where $f_1 \neq f_2$ and M and N are positive integers and are defined as follows:

$$M = \frac{T_2}{|T_2 - T_1|}$$

$$N = \frac{T_1}{|T_2 - T_1|}$$

$$\frac{T_2 - T_1}{T_2} f_1 = \frac{T_2 - T_1}{T_1} f_2$$

$$\frac{f_1}{T_2} = \frac{f_2}{T_1} \quad \text{where } f_1 = \frac{1}{T_1} \text{ and } f_2 = \frac{1}{T_2}$$

$$\frac{1}{T_1 T_2} = \frac{1}{T_1 T_2}$$

or $$f_1 f_2 = f_1 f_2$$

When the digital word used to program applicants' inventive delay is increased by one, for example 1, (001) to 2, (010) each counter counts an additional clock period namely $T_1$ and $T_2$, respectively. Thus, the time delay, or time occurrence of the delayed pulse, is increased relative to the time reference, or reference pulse, by a time period of $T_2 - T_1$ for each increase in the count of the digital word programmed.

Either clock may be used as the basic reference with the feedback to the other as the control, or VCO.

A High Resolution digitally Programmable Delay constructed and operated by applicants' had the following parameters:

$T_1 = 9$ nanoseconds (111.1 Megahertz reference)*
$T_2 = 8$ nanoseconds (125 Megahertz, VCO)*
Resolution $= T_2 - T_1 = 1$ nanosecond
$M = 8$
$N = 9$

* It will be appreciated that in an application or utilization of applicants' novel and inventive programmable delay circuit either clock may be utilized as the reference.

In the structure constructed and operated by applicant, the signals to the phase detector had a period of 72 nanoseconds, namely $T_1 \times M = 9 \times 8 = 72$; and $T_2 \times N = 8 \times 9 = 72$.

The programmable delay circuit provided a programmable delayed timing signal relative to a reference signal with significantly more resolution than could be obtained by merely digitally counting clock pulses from a single clock source. The practice of applicants' invention reduces to a minimum the use of analog circuitry. The accuracy or resolution of applicants delay circuit is not affected by program changes. The programmable delay range of applicants programmable delay circuit may be increased without sacrificing resolution by merely increasing the number of bits in the counters associated with the respective clocks. Since applicants' programmable delay is essentially constructed from digital logic blocks, repeat build thereof and alignment is materially simplified.

As will be fully apparent from the detailed description of applicants' invention set-forth hereinafter, applicants High Resolution Digitally Programmable Electronic Delay may be readily optimized for Multi-Channel Operation. Multi-channel operation may be defined as the obtaining of a plurality of individually programmable delay time periods all within a given time period, and all with reference to a single reference time within said given time period.

In a further embodiment of applicants' invention, as will be disclosed hereinafter, when the digital input word is increased, each counter produces an output at the time when the value of the counter (clock periods of delay) is equal to the respective binary data programmed into it. This will cause T dealy to increase relative to T reference. T delay then, is equal to the number of $T_1$ clock periods plus the number of $T_2$ clock periods added together. In this embodiment, T reference repeats every cycle at the same point in time.

A High Resolution Digitally Programmable Electronic Delay taking the form of this further embodiment of applicants' invention was constructed and operated employing the following parameters.

$T_1 = 9$ nanoseconds (111.1 Megahertz, Reference)
$T_2 = 8$ nanoseconds (125 Megahertz, Reference)
Resolution = 1 nanosecond ($T_1 - T_2$)
$M = 8$
$N = 9$ In this further embodiment, the signals to the phase detector, T reference and T delay, all have a repeat cycle time of 72 nanoseconds. ($T_1 \times M = 9 \times 8 = 72$). The seven binary bit digital input word provides 72 positions, in increments of 1 nanosecond. Namely, delays of 0, 1, 2, 3 - - - - 68, 69, 70 and 71 may be respectively programmed.

In the above further embodiment of applicants' invention, which is also applicants preferred embodiment, in order to simplify increased program steps of 1 nanosecond each, the 9 nanosecond counter is increased one count and the 8 nanosecond counter is decreased one count. Counts are removed from the 8 nanosecond counter repeating every 9 steps. In accomplishing the above, a ROM (Read Only Memory) with all the values of counts stored therein is utilized and found to be of particular utility. Namely, the ROM provides the proper counts for each counter for each programmed delay or step.

In the detailed description and disclosure of applicants' invention and preferred embodiment, set forth hereinafter, a complete and ready understanding of applicants' invention and the practice thereof will be fully apparent to persons skilled in the art.

As is well known, numerous types of delay circuits, timing circuits and elapsed time records are known to the art and find wide application. From simple R-C circuits to sophisticated timing techniques, are known and employed by the art for various applications. Applicants' High Resolution Digitally Programmable Delay may be advantageously employed in either a single channel embodiment or a multi-channel embodiment in numerous applications known to the art. The precision and simplicity of applicants' programmable delay affords particular utility thereto in the semiconductor industry. As will be readily apparent to persons skilled in the art, applicants' programmable delay has particular utility and may be advantageously employed in the testing of semiconductor devices fabricated byy Large Scale Integration (LSI) techniques.

A primary object of the invention is to provide an improved High Resolution Digitally Programmable Electronic Delay.

A further object of the invention is to provide an improved High Resolution Digitally Programmable Electronic Timer.

A further object of the invention is to provide an improved High Resolution Digitally Programmable Electronic Delay Means for Multi-channel Operation.

A further object of the invention is to provide an improved High Resolution Digitally Programmable Electronic Timer Means for Multi-Channel Operation.

A further object of the invention is to provide a High Resolution Programmable Timing signal with 100% useful range and a minimum of analog circuitry.

A further object of the invention is to provide a High Resolution Programmable timing signal that is adaptable to a system environment.

A further object of the invention is to provide a High Resolution Programmable Time Reference circuit which is very stable and accurate.

A further object of the invention is to provide a precision stable and accurate timing circuit that is readily constructed and simple and reliable in operation.

A further object of the invention is to provide an improved multi-channel delay system wherein each channel of said system has an independently programmable digital time delay circuit of high resolution and reliability.

A further object of the invention is to provide high resolution digitally programmable electronic delay apparatus consisting essentially of digital circuitry whereby alignment and calibration of the apparatus is minimized and simplified.

A further object of the invention is to provide high resolution digitally programmable electronic delay apparatus wherein Dual In-Line Packages of circuitry are extensively employed and repeat build of the circuitry is thereby simplified.

A further object of the invention is to provide a high resolution programmable timing signal with relatively long time delays with 100% useful range.

A further object of the invention is to provide an improved time delay circuit for advantageous utilization in various applications known to the art.

A still further object of the invention is to provide improved test equipment incorporating the teaching of applicants' invention.

A still further object of the invention is to provide improved elelctronic test equipment employing applicants' High Resolution Programmable Timing Apparatus.

A major objective of applicants' invention is the provision of improved Electronic time delay and measurement apparatus for the testing of high speed semiconductor circuitry.

A further major objective of applicants' invention is the provision of precision time delay and measurement apparatus for testign semiconductor structures fabricated by Large Scale Integration (LSI) techniques.

A very significant objective of the invention is to provide circuitry which renders precision time delays in precise increments of 1 nanosecond.

Alternatively, a very significant objective of the invention is the provision of elapsed time measurement apparatus where elapsed time intervals as small as 1 nanosecond may be measured with precision.

A still further objective of the invention is to provide circuitry which renders precision time delays in precise increments of a fractional portion of a nanosecond.

BRIEF DESCRIPTION OF THE DRAWINGS

Referring to FIG. 1, an embodiment of the invention and its operation will be explained with the aid of illustrative examples of operation.

Figure 1:
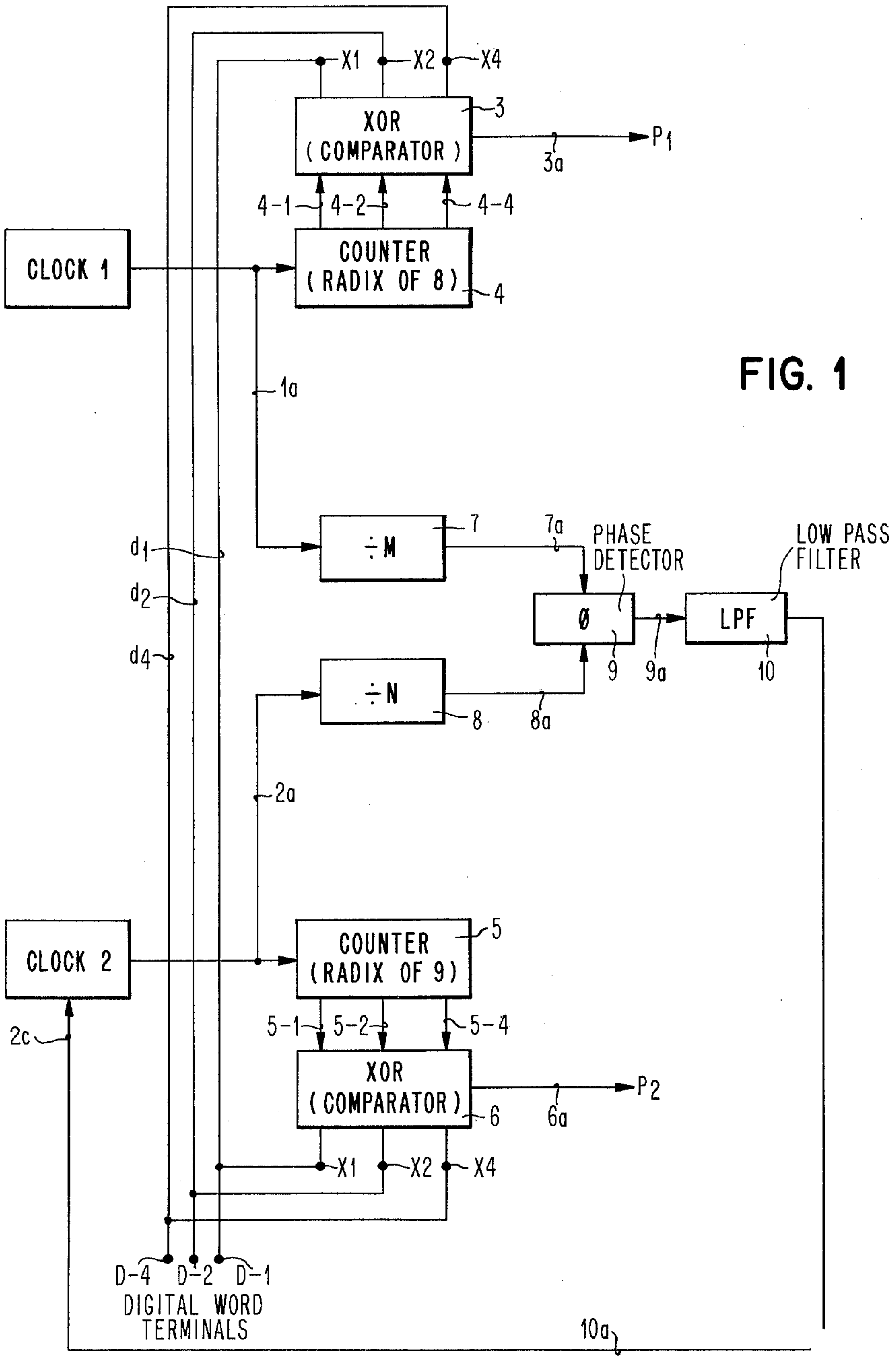
FIG. 1 is a block diagram schematically representing an embodiment of the invention.

For purposes of explanation, assume the following conditions: Clock 1 is a stable reference providing an output at a frequency of $f_1$ and a clock period of $T_1$, where $f_1$ is 111.1 Megahertz and $T_1$ is 9 nanoseconds. Clock 1 may be a crystal controlled stable oscillator. Clock 2 is controllable. Clock 2 provides an output at a frequency of $f_2$ and a clock period of $T_2$, where $f_2$ is 125 Megahertz and $T_2$ is 8 nanoseconds.

The output of clock 1 is connected via lead 1*a* to the input of counter 4 and to the input of divider circuit 7. The output of clock 2 is connected via lead 2*a* to the input of counter 5 and to the input of divider circuit 8. The outputs of divider circuits 7 and 8 are, respectively, coupled via leads 7*a* and 8*a* to the first and second inputs of phase detector 9. The output of phase detector 9 is coupled via lead 9*a*, low pass filter 10, and lead 10*a* to the control input 2*c* of clock 2.

Counters 4 and 5, in this illustrative embodiment and example of operation of the invention, are each binary counters. Counter 4 has a radix of 8, assuming in succession, in response to pulses from clock 1, the following count states 0, 1, 2, 3, 4, 5, 6 and 7. Counter 5 has a radix of 9 assuming in succession in response to pulses from clock 2, the following count states 0, 1, 2, 3, 4, 5, 6, 7 and 8. The outputs from the first ($2^0$), second ($2^1$) and third ($2^2$) stages of counters 4 and 5, are respectively, designated as 4-1, 4-2, 4-4 and 5-1, 5-2, 5-4. The counters 4 and 5, respectively cycle through the following states, or counts, in response to input pulses; namely, 0, 1, 2, 3, 4, 5, 6 and 7 for counter 4 and 0, 1, 2, 3, 4, 5, 6, 7 and 8 for counter 5.

Digital Word Terminals D-1, D-2 and D-4 are connected to XOR (comparator) 3 and XOR (comparator) 6. Namely, lead $d_1$ connects terminal D-1 with termianl $x_1$ of XOR 3 and terminal $x_1$ of XOR 6; lead $d_2$ connects terminal D-2 with terminal $x_2$ of XOR 3 and terminal $X_2$ of XOR 6; and lead $d_4$ connects terminal D-4 with terminal $x_4$ of XOR 3 and terminal $x_4$ of XOR 6.

XOR 3 and 6 are respectively, comparators. XOR 3 compares the digital word impressed on the Digital Word Terminals with the contents, or count, within counter 4. XOR 6 compares the digital word impressed on the Digital Word Terminals with the contents, or count, within counter 5. XOR 3 and 6 may be Exclusive OR circuit means or any one of a number of comparators well known to the art. When the count contained within counter 4 is equal to the magnitude of the binary digital word impressed on the Digital Word Terminals (D-1, D-2, D-4), the comparator 3 will electrically manifest the condition by providing a pulse $P_1$ on lead 3*a*. When the count contained within counter 5 is equal to the magnitude of the binary digital word impressed on the Digital Word Terminals (D-1, D-2, D-4), the comparator 6 will electrically manifest the condition by providing a pulse $P_2$ on lead 6*a*.

Divider circuits 7 and 8 are, respectively, frequency divider circuits. Divider 7 divides, or steps down, the frequency of clock 1 by a factor of M, where M is a positive integer. Divider 7 for purposes of explanation may be considered a counter of radix M. Divider 7 will provide an output for every $M^{th}$ input from clock 1. The output frequency of divider 7 is $(f_1/M)$. Correspondingly, Divider 8 provides an output for every $N^{th}$ input from clock 2. The output frequency of divider 8 is $(f_2/N)$.

The inputs to phase detector 9 are respectively at frequencies of $(f_1/M)$ and $(f_2/N)$. The output of phase detector 9 is employed, via Low Pass Filter 10, to maintain the relative time position of clocks 1 and 2 constant. Namely, clocks 1 and 2 are periodically synchronized. Every $MT_1$ nanoseconds clocks 1 and 2 are phase synchronized. Thus $MT_1$ must be and is maintained equal to $NT_2$. It follows that to accomplish this condition $(f_1/M)$ should equal $(f_2/N)$, of $Nf_1 = Mf_2$.

Where $f_1 = 111.1 +$ megahertz and $f_2 = 125$ megahertz 111.1 (N) = 125 (M)

Substituting [ILLUSTRATIVE EXAMPLE]

N = 9

M = 8

(111.1=) (9) = 125 (8)

1000 = 1000

Now still referring to FIG. 1, assume the digital word impressed on Digital Word Terminals (D-1, D-2 and D-4) has a magnitude of 1. Namely, an electrical manifestation of a binary zero is impressed on each of the terminals D-2 and D-4 and an electrical manifestation of a binary one is impressed on terminal D-1. Counter 5 will manifest a binary 1 count after 8 nanoseconds in response to the first input from clock 2. Comparator 6 will provide an output pulse $P_2$ on line 6*a* in response to the equality of the binary word impressed on the Digital Word Terminals and the contents of counter 5. Counter 4 will manifest a binary 1 count after 9 nanoseconds in response to the first input from clock 1. Comparator 3 will provide an output pulse $P_1$ on line 3*a* in response to the equality of the binary word impressed on the Digital Word Terminals and the contents of counter 4. Pulses $P_1$ and $P_2$ are displaced one from the other by a time interval of one nanosecond when the delay circuit of FIG. 1 is programmed by a digital one impressed on terminals D-1, D-2 and D-4.

Divider circuits 7 and 8 will respectively provide inputs to phase detector 9 after 72 nanoseconds. The output of Divider 8, when N is equal to 9, occurs after 9 clock cycles of clock 2. Namely, $T_2 \times N = 8 \times 9 = 72$ nanoseconds. The output of Divider 7, when M is equal to 8, occurs after 8 clock cycles of clock 1. Namely, $T_1 \times M = 9 \times 8 = 72$ nanoseconds. Thus, inputs to Phase Detector 9 from divider circuits 7 and 8 are substantially concurrent. Phase Detector 9 via Low Pass Filter 10 provides a control signal to clock 2 every 72 nanoseconds to synchronize the clock system 1 and clock system 2. Clock system 1 is clock 1 and divider 7. Clock system 2 is clock 2 and divider 8.

From the above, it is now apparent that with a programmed digital input of one, the circuitry of FIG. 1 will provide a pair of pulses $P_1$ and $P_2$, displaced in time one nanosecond every 72 nanoseconds every 72 nanoseconds until the programmed digital input thereof is changed.

Figure 1A:
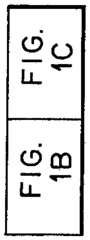
FIGS. 1B and 1C, placed together as shown in FIG. 1A, disclose illustrative waveforms to be viewed in conjunction with the examples of the operation of the embodiment of FIG. 1.
Figure 1C:
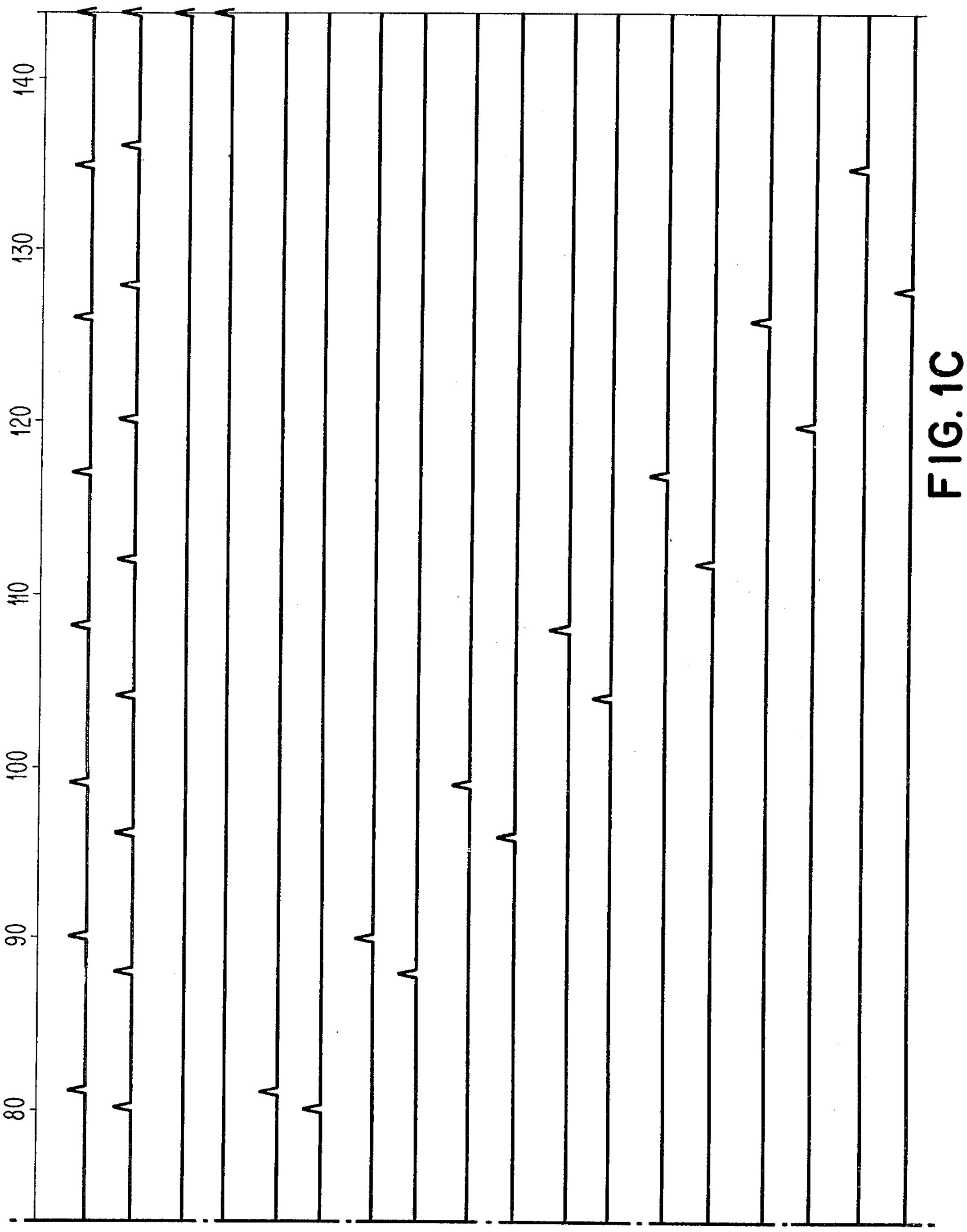
Figure 1B:
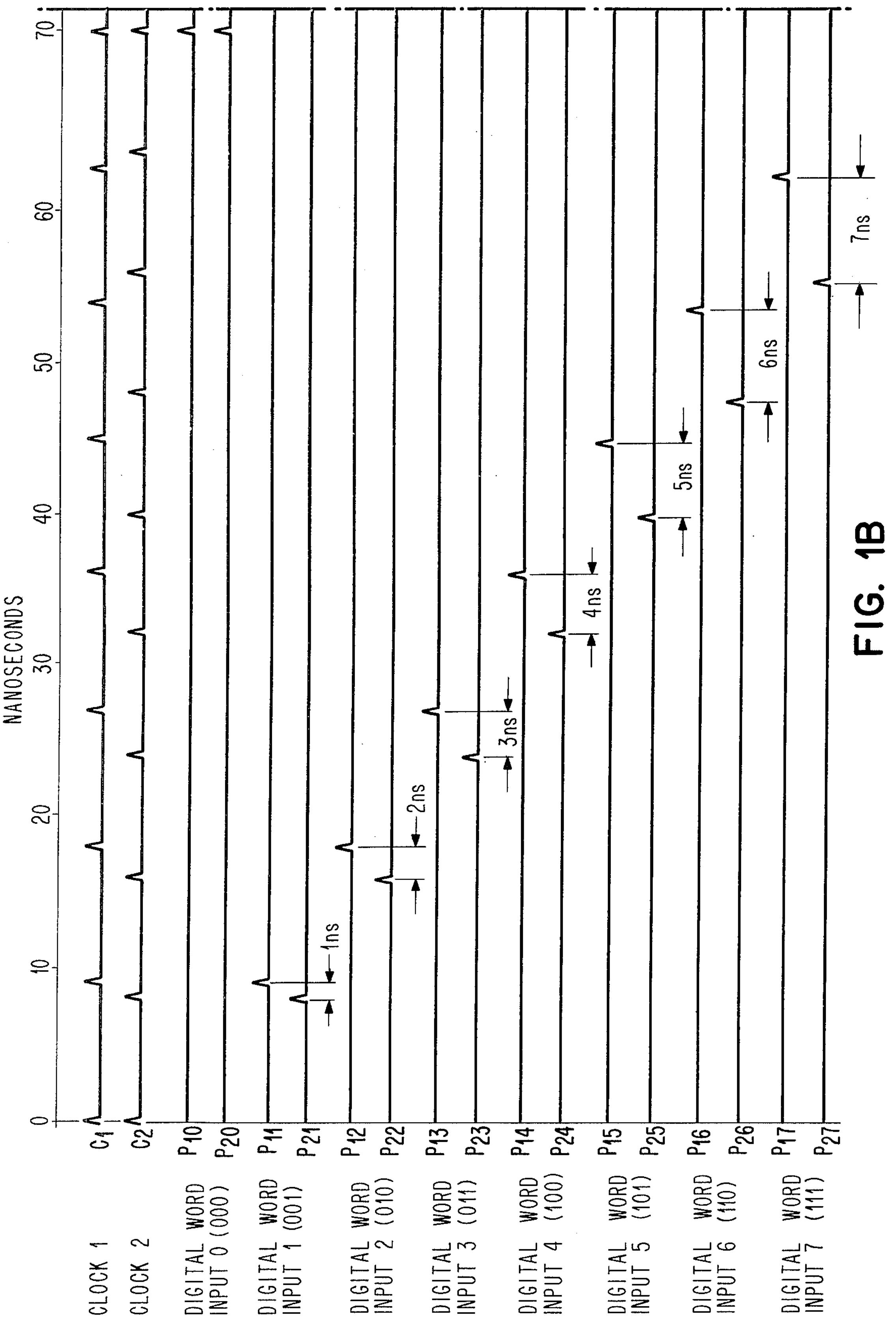

Now referring to FIG. 1A, waveforms $C_1$ and $C_2$ represent the outputs of clocks 1 and 2 respectively. As seen in FIG. 1A, every 72 nanoseconds clocks 1 and 2 are synchronized. Further, it is seen from waveforms $P_{11}$ and $P_{21}$ of FIG. 1A that with a programmed digital input of one, a pair of pulses displaced in time one nanosecond is provided by the circuit of FIG. 1 every 72 nanoseconds.

Still referring to FIG. 1A, attention is directed to the legend Digital Word Input 2 (010) and waveforms $P_{12}$ and $P_{22}$. With a digital input of 2 (010) impressed via Digital Word Terminals D-1, D-2 and D-4 on terminals $x_1$, $x_2$, and $x_4$ of each of the comparator circuits 3 and 6, a $P_1$ pulse will be provided when counter 4 has a count of 2 stored therein and a $P_2$ pulse will be provided when counter 5 has a count of 2 stored therein. As seen from Waveform $C_1$, counter 4 will reach a count of 2 after the $18^{th}$ nanosecond of each 72 nanosecond retiming period. As seen from Waveform $C_2$, counter 5 will reach a count of 2 after the $16^{th}$ nanosecond of each 72 nanosecond retiming period. Thus, as seen from Waveforms $P_{12}$ and $P_{22}$, the $P_1$ pulse from comparator 3 is displaced in time two nanoseconds from the $P_2$ pulse from comparator 6 when the digital input is 2 (010).

Chart 1 Summarizing Operation of Circuit of Fig. 1

| Digital Word Input Impressed on Terminals D-4, D-2, D-1 | Time interval in Nanoseconds Between $P_1$ and $P_2$ Pulses | Representative Waveforms in Figure 1A |
|---|---|---|
| 000 | 0 | $C_1$, $C_2$, $P_{10}$, $P_{20}$ |
| 001 | 1 | $C_1$, $C_2$, $P_{11}$, $P_{21}$ |
| 010 | 2 | $C_1$, $C_2$, $P_{12}$, $P_{22}$ |
| 011 | 3 | $C_1$, $C_2$, $P_{13}$, $P_{23}$ |
| 100 | 4 | $C_1$, $C_2$, $P_{14}$, $P_{24}$ |
| 101 | 5 | $C_1$, $C_2$, $P_{15}$, $P_{25}$ |
| 110 | 6 | $C_1$, $C_2$, $P_{16}$, $P_{26}$ |
| 111 | 7 | $C_1$, $C_2$, $P_{17}$, $P_{27}$ |

From Chart 1 and FIG. 1A, it is apparent that delays or time intervals of 0, 1, 2, 3, 4, 5, 6 or 7 nanoseconds may be programmed by merely impressing an electrical manifestation of 0, 1, 2, 3, 4, 5, 6 or 7, respectively, on terminals D-4, D-2, D-1 of the circuit of FIG. 1.

It will be appreciated by those skilled in the art that numerous modifications and parameter variations may be made to the apparatus of FIG. 1 without departing from the spirit and practice of applicants' invention.

The parameter changes may involve any and or all of the following. The frequency or periods of Clocks 1 and 2. The radices of counters 4 and 5 with corresponding modifications in comparators 3 and 6. The values of M and N. As evident from the afore-recited detailed description of the circuit of FIG. 1, the change of one parameter may necessitate or dictate the change of further parameters.

One modification of FIG. 1 is to synchronize Clocks 1 and 2 every 144 nanoseconds. This modification dictates a doubling of the radix of dividers 7 and 8. (Namely M = 16 and N = 18). Also the radix of counter 5 is doubled, from 9 to 18. The radix of counter 4 is doubled from 8 to 16. The comparators 3 and 4 are each increased one bit position namely, $x_8$. The Digital Word Input terminals are increased one bit position namely, D-8. by this modification, a delay, or time interval, of 0, 1, 2, 3, 4, 5, 6, 7, 8, 9, 10, 11, 12, 13, 14 or 15 may be selectively programmed by a four bit binary digital word impressed on Digital Word Input terminals D-8, D-4, D-2 and D-1.

Chart 2 summarizes the operation of the system of FIG. 1 when modified as set-forth above.

Chart 2

Modification of Circuit of Figure 1
Radix of Counter 4 = 16 $f_1$ = 111.1 Megahertz $T_1$ = 9 nanoseconds
Radix of Counter 5 = 18 $f_2$ = 125.0 Megahertz $T_2$ = 8 nanoseconds
M = 16, N = 18
Programmed by 4 binary bit word ($D_8$, $D_4$, $D_2$, $D_1$)

| Digital Word Input Impressed on Terminals D-8, D-4 D-2, D-1 | Time Interval in Nanoseconds Between $P_1$ and $P_2$ Pulses | No. of Clock Periods of Clock 2 | No. of Clock Periods of Clock 1 |
|---|---|---|---|
| 0000 | 0 | 0 | 0 |
| 0001 | 1 (9–8) | 1 (8 ns.) | 1 (9 ns.) |
| 0010 | 2 (18–16) | 2 (16 ns.) | 2 (18 ns.) |
| 0011 | 3 (27–24) | 3 (24 ns.) | 3 (27 ns.) |
| 0100 | 4 (36–32) | 4 (32 ns.) | 4 (36 ns.) |
| 0101 | 5 (45–40) | 5 (40 ns.) | 5 (45 ns.) |
| 0110 | 6 (54–48) | 6 (48 ns.) | 6 (54 ns.) |
| 0111 | 7 (63–56) | 7 (56 ns.) | 7 (63 ns.) |
| 1000 | 8 (72–64) | 8 (64 ns.) | 8 (72 ns.) |
| 1001 | 9 (81 –72) | 9 (72 ns.) | 9 (81 ns.) |

Chart 2 -Continued

Modification of Circuit of Figure 1
Radix of Counter 4 = 16 $f_1$ = 111.1 Megahertz $T_1$ = 9 nanoseconds
Radix of Counter 5 = 18 $f_2$ = 125.0 Megahertz $T_2$ = 8 nanoseconds
M = 16, N = 18
Programmed by 4 binary bit word ($D_8$, $D_4$, $D_2$, $D_1$)

| Digital Word Input Impressed on Terminals D-8, D-4 D-2, D-1 | Time Interval in Nanoseconds Between $P_1$ and $P_2$ Pulses | No. of Clock Periods of Clock 2 | No. of Clock Periods of Clock 1 |
|---|---|---|---|
| 1010 | 10 (90–80) | 10 (80 ns.) | 10 (90 ns.) |
| 1011 | 11 (99–88) | 11 (88 ns.) | 11 (99 ns.) |
| 1100 | 12 (108–96) | 12 (96 ns.) | 12 (108 ns.) |
| 1101 | 13 (117–104) | 13 (104 ns.) | 13 (117 ns.) |
| 1110 | 14 (126–112) | 14 (112 ns.) | 14 (126 ns.) |
| 1111 | 15 (135–120) | 15 (120 ns.) | 15 (135 ns.) |

PREFERRED EMBODIMENT

Figure 2:
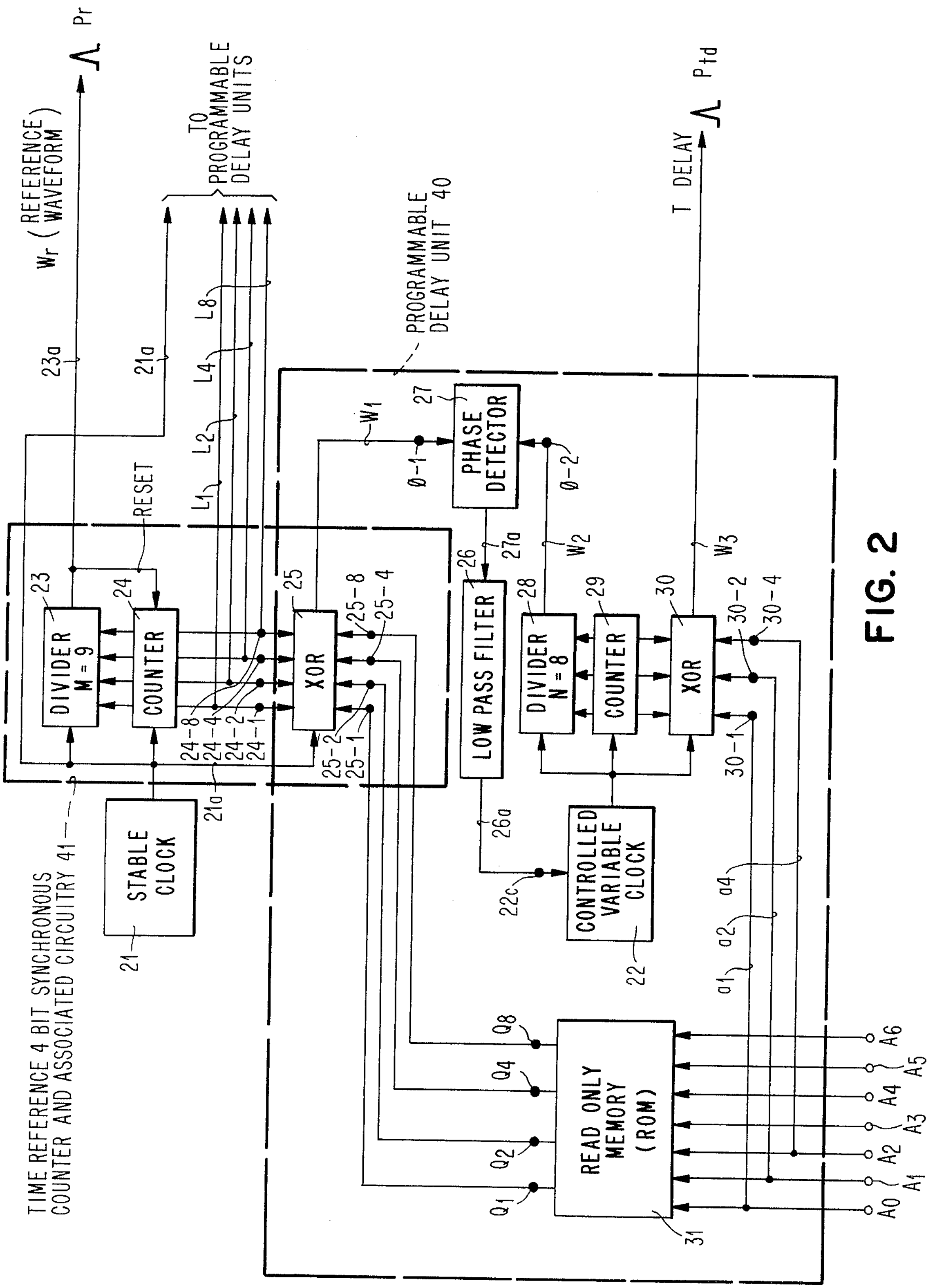
FIG. 2 is a block diagram schematically representing the preferred embodiment of the invention.

Reference is made to FIG. 2. Clock 21 provides a frequency stable output at a frequency of $f_1$ and a clock period of $T_1$. In this description of the preferred embodiment, $f_1 = 125$ megahertz and $T_1 = (1/f_1) = 8$ nanoseconds. Clock 22 is a controllable source and provides an output designated as frequency $f_2$ and a clock period of $T_2$. When a clock 22 is in steady-state operation (synchronized with clock 21), namely phased locked with clock 21, $f_2 = 111.1$ megahertz and $T_1 = 9$ nanoseconds. The Time Reference 4 Bit Synchronous Counter and Associated Circuitry 41 is coupled to the output of clock 21. The circuitry enclosed by broken line 41 includes a divider circuit 23, a four stage binary counter 24 and a comparator circuit 25. Divider circuit 23 divides the output of clock 21 by a factor of 9. Counter 24 may be a modified four stage binary counter and counts the output of clock 21. Counter 24 is modified in that it has a radix of 9, since it is reset by the output of divider 23 after every $9^{th}$ pulse from clock 21. Counter 24, in response to input pulses from clock 21 assumes the following states: 1000, 0100, 1100, 0010, 1010, 0110, 1110, 0001 and 0000. In this preferred embodiment, a reference pulse Pr is manifested on line 23*a*, the output of divider 23, every 72 nanoseconds.

The output of clock 22 is impressed on the inputs of divider 28, counter 29 and comparator 30, respectively. Divider 28 divides the output of clock 22 by a factor of 8. Counter 29 may be a three stage binary counter. Counter 29 has a radix of 8. Counter 29, in response to input pulses from Clock 22 assumes the following states: 100, 010, 110, 001, 101, 011, 111 and 000. As will be fully apparent, from the detailed description that follows, time displaced pulse $P_{td}$ is manifested on lead $W_3$, the output of comparator 30, *n* nanoseconds after the reference pulse Pr, where *n* is any integer from 0 through 72. Where, as will be fully apparent from the detailed description that follows, *n* is determined by the following expression, EQUATION NUMBER No. 1

[Decimal Equivalent of binary input impressed on terminals 25-1, 25-2, 25-3 25-4 and 25-8 of comparator 25] × [8 nanoseconds (Period of clock 21)] + [Decimal Equivalent of binary input impressed on terminals 30-1, 30-2 and 30-4 of comparator 30] × [9 nanoseconds (Period of clock 22)]

From FIG. 2, it is seen that output of comparator 25 is connected via lead $W_1$ to the first input of φ-1 of Phase Detector 27. The output of Divider 28 is connected via lead $W_2$ to the second input φ-2 of Phase Detector 27. The output of Phase Detector 27 is connected via lead 27*a*, Low Pass Filter 26, and lead 26*a* to control input 22*c* of clock 22.

As stated earlier, clock 22 has a controllable period $T_2$. Control of clock 22 is accomplished by the control input impressed on control input 22*c* of clock 22. The control input for clock 22 is provided, via Low Pass Filter 26, by the Phase Detector 27. Phase Detector 27 is responsive to outputs from comparator 25 and Divider 28. Comparator 25 will provide an output pulse when the binary count in counter 24 is equal to the binary manifestation impressed on terminals 25-1, 25-2, 25-4 and 25-8 of comparator 25. Divider 28 will provide an output in response to every eighth input pulse from clock 22. As will be more readily apparent from the description that follows, for certain very short intervals of time while clock 21 and clock 22 are being urged into synchronism under control of the phase detector means, clock 22 will provide an output at a frequency other than the frequency $f_2$ (111.1 MHZ). During the afore-mentioned short intervals of time, when clocks 21 and 22 are not in synchronism, but moving toward synchronism (in response to the signal on control input 2c of clock 22) the output frequency $f_2$ of clock 22 will be either less than 111.1 MHZ or greater than 111.1 MHZ. Correspondingly, when the frequency $f_2$ is greater than 111.1 MHZ the period of clock 22 ($T_2$) is less than 9 nanoseconds: and, when the frequency $f_2$ is less than 111.1 MHZ the period of clock 22 ($T_2$) is greater than 9 nanoseconds. It will be appreciated that divider 28 will provide an output in response to every eighth input pulse from clock 22, regardless of whether the frequency of clock 22 is increasing from a frequency below 111.1 MHZ toward the synchronous frequency $f_2 = 111.1$ MHZ, or is decreasing from a frequency above 111.1MHZ to the synchronous frequency $f_2 = 111.1$ MHZ. All under control of the output of Phase Detector 27 being applied via Low Pass Filter 26 on control input 22c of clock 22.

The operation of the programmable delay apparatus generally depicted in FIG. 2 will now be described and explained with reference to a number of illustrative examples of operation.

Assume for purposes of explanation that the afore-recited circuitry is in operation with an electrical manifestation of the binary number 0000 impressed on terminals 25-1, 25-2, 25-4 and 25-8 of comparator 25 and an electrical manifestation of the binary number 000 impressed on terminals 30-1, 30-2 and 30-4 of comparator 30. It will be apparent that a reference pulse Pr will be provided on lead 23*a* every 72 nanoseconds by the output of divider 23. Namely: $9 \times T_1 = 72$ nanoseconds, where $T_1 = 8$ nanoseconds. It will also be apparent that a time displaced pulse will be provided on lead $W_3$ every 72 nanoseconds by the output of comparator 30. Namely: $8 \times T_2 = 72$ nanoseconds, where $T_2 = 9$ nanoseconds. In this example n=o, since the time displaced pulse $P_{td}$ occurs 0 nanoseconds after the reference pulse Pr. In the above example of operation, where $n = 0$, the circuit is in steady-state operation and the following conditions exist:

clock 21 and clock 22 are phase locked.

Clock 21 provides an output at a frequency of $f_1 = 125$ MHZ and clock period of $T_1 = 1/f_1 = 1/(125 \times 10^6) = 8$ nanoseconds.

Divider 23 provides a reference pulse Pr every 72 nanoseconds ($9 \times 8 = 72$ nanoseconds). Every 72 nanoseconds, concurrently with the reference pulse Pr, comparator 25 provides an output pulse that is impressed, via lead $W_1$, on phase detector input $\phi$-1. Every ninth pulse of clock 21, counter 24 has a count of 0000 therein, which is equal to the binary number 0000 impressed on terminals 25-1, 25-2, 25-4 and 25-8 of comparator 25.

Clock 22 provides an output at a frequency of $f_2 = 111.1$ MHZ and clock period of $T_2 = 1/f_2 = 1(111.1 \times 10^6) = 9$nanoseconds. Every72 nanoseconds, concurrently with the reference pulse Pr, Divider 28 provides an output pulse that is impressed, via lead $W_2$, on phase detector input $\phi$-2. Every 72 nanoseconds, concurrently with the reference pulse Pr, comparator 30 provides a time displaced pulse $P_{td}$. Every eighth pulse of clock 22, counter 29 has a count of 000 therein, which is equal to the binary number 000 impressed on terminals 30-1, 30-2 and 30-4 of comparator 30. Clocks 21 and 22 are synchronized by the output of phase detector 27, via Low Pass Filter 26, being impressed on control input 22c of clock 22. Thus with binary manifestations of 0000 and 000 respectively impressed on the afore-mentioned terminals of comparators 25 and 30, the reference pulse Pr and the time displaced pulse $P_{td}$ are concurrent. Namely, $n = 0$, the time displaced pulse $P_{td}$ is displaced zero nanoseconds from the reference pulse Pr.

Now assume for a second example of operation that a binary manifestation of 0001 has been impressed on terminals 25-1, 25-2, 25-4, 25-8 of comparator 25 and concurrently therewith a binary manifestation of 100 has been impressed on terminals 30-1, 30-2 and 30-4 of comparator 30. Recalling that under the parameters of this illustrative embodiment of applicants' invention that clock 21 is a stable source providing an output pulse every 8 nanoseconds, it will be seen that comparator 25 will impress a synchronizing pulse on phase detector input $\phi$-1 every 72 nanoseconds, but displaced in time from Pr by 64 nanoseconds. It will be appreciated that a transient period will occur each time the binary manifestations respectively impressed on comparators 25 and 30 are changed. This will be evident from noting that phase detector 27 receives inputs from comparator 25 and Divider 28, respectively. Under the conditions of this example, namely a change in the binary manifestation from 0000 to 0001 on the inputs of comparator 25, the inputs to the phase detector 27 from comparator 25 will not be initially concurrent with the input to the phase detector 27 from divider 28. The phase detector will initially, during this short transient period, receive an input from comparator 25 shortly prior in time to the input received from Divider 28. The phase detector 27 will provide a synchronizing control signal, via low pass filter 26 to control input 22*c* clock 22. In this transient period, the phase detector means will in essence progressively bring clocks 21 and 22 back into a phase locked condition. This transient period is of short duration, the length of time duration of the transient period being typically in the order of 200 microseconds. Admittedly, during this short transient period, the time displacement between the reference pulse Pr and the timed displacement pulse $P_{td}$ is lacking in precision.

Under the assumed conditions of the foregoing example, and subsequent to the transient period, namely clocks 21 and 22 are phased locked, the following conditions exist. Clock 21, as at all times under these examples is operating at frequency $f_1$ (125 MHZ), and a clock period of $T_1$ (8 nanoseconds). With the binary quantity 0001 impressed on terminals 25-1, 25-2, 25-4 and 25-8, comparator 25 will provide an output every 72 nanoseconds in coincidence with counter 24 having a count of 8 (0001) therein and manifested on terminals 24-1, 24-2, 24-4 and 24-8. Divider 23 will provide a reference pulse Pr on lead 23*a* every 72 nanoseconds. It will be noted that although the output pulse from comparator 25 is periodic, every 72 nanoseconds, it occurs 8 nanoseconds prior in time than the reference pulse, Pr. Namely, during every 72 nanosecond period of the reference pulse Pr, the pulse on lead $W_1$ occurs at the $64^{th}$ nanosecond therein. When clocks 21 and 22 are synchronized (or phase locked) the Phase Detector inputs ($\phi$-1 and $\phi$-2) from comparator 25 and Divider 28 are concurrent. Namely, every 64 nanosecond of every 72 nanosecond period of the reference pulse Pr. Clock 22 provides a pulse every 9 nanoseconds. Divider 28 provides an output pulse every 72 nanoseconds concurrent with the output pulse from comparator 25. With the binary quantity 100 impressed on terminals 30-1, 30-2 and 30-4, comparator 30 will provide a time displaced pulse $P_{td}$ every 72 nanoseconds, when counter 29 manifests a count of binary 100. Counter 29 will manifest a count of 100 one clock period of clock 22 (9 nanoseconds) after divider 28 provides an output pulse to phase detector input $\phi$-2. Divider 28 provides an output pulse every 64th nanoseconds of every 72 nanosecond period of the reference pulse Pr. The time displaced pulse $P_{td}$ is provided by comparator 30 every 72 nanoseconds, 9 nanoseconds later in time than the concurrent output pulses from comparator 25 and divider 28, respectively. Thus the reference pulse Pr may be considered to occur on the $0^{th}$, $72^{nd}$, $144^{th}$, $216^{th}$, $288^{th}$, $360^{th}$, etc. nanosecond in time and the time displaced pulse $P_{td}$ may be considered to occur on the $1^{st}$, $73^{nd}$, $145^{th}$, $217^{th}$, $288^{th}$, $361^{st}$, etc. nanosecond in time.

From the above, it is apparent that the time displaced pulse $P_{td}$ occurs one nanosecond after the reference pulse Pr. when a binary quantity of 0001 is impressed on selector terminals (25-1, 25-2, 25-4 and 25-8) of comparator 25 concurrently with a binary quantity of 100 being impressed on the selector terminals (30-1, 30-2 and 30-4) of comparator 30.

Referring to Equation No. 1, supra it is to be noted that (8×8) + (1×9) = 73 and 73−72=1, 0 + 73 = 73, 72 + 73 = 145, 144 + 73 = 217, - - - etc. - - - -.

Now as a further example of the operation of the programmable delay of FIG. 2 assume the following conditions. clocks 21 and 22 are synchronized and in steady-state operation. The selector terminals of comparator 25 has the binary quantity 1110 impressed thereon. The selector terminals of comparator 30 has the binary quantity 010 impressed thereon. Comparator 25 will provide an output pulse every $56^{th}$ nanosecond of every 72 nanosecond period of the reference pulse Pr. Clock 22 is synchronized with clock 21 and this synchronism is predicated on the concurrent pulses from the comparator 25 (input $\phi$-1 of the phase detector) and divider 28 (input $\phi$-2 of the phase detector), respectively, occurring at the $56^{th}$ nanosecond of each 72 nanosecond period between reference pulses Pr. With an input of 010 impressed on the selector terminals of comparator 30, a time displaced pulse $P_{td}$ will occur every 72 nanoseconds. Each time displaced pulse will be displaced in time 18 nanoseconds from the pulses impressed on the first and second inputs ($\phi$-1 and $\phi$-2) of the phase detector. Thus it is apparent reference pulses Pr will occur every 72 nanoseconds and time displaced pulses $P_{td}$ will occur every 72 nanoseconds. Each time displaced pulse $P_{td}$ occurs two nanoseconds later than the reference pulse Pr corresponding thereto. Namely reference pulses Pr will occur on the $0^{th}$, $72^{nd}$, $144^{th}$, $216^{th}$, $288^{th}$, $360^{th}$, etc. - - - nanosecond in elapsed time and time displaced pulses $P_{td}$ will occur on the $2^{nd}$, $74^{th}$, $146^{th}$, $218^{th}$, $290^{th}$, $362^{nd}$ - - - - etc. - - - - nanosecond in elapsed time.

Again referring to Equation No. 1, supra it is to be noted that (7×8) + (2×9) = 74, and 74−72=2, 0+74=74, 72+74=146, 144+74=218, etc. - - - - - .

Now as a still further example of the operation of the programmable delay of FIG. 2, with the circuitry thereof in steady-state operation and the binary quantity 0110 impressed on the selector terminals of comparator 25 and the binary quantity 110 impressed on the selector terminals of comparator 30, it will be apparent that each time displaced pulse $P_{td}$ will occur 3 nanoseconds later in time than the reference pulse Pr corresponding thereto. Briefly summarizing, the conditions of operation for this example are: a reference pulse Pr is provided every seventy-two nanoseconds; the phase detector receives first and second, essentially concurrent, inputs, respectively, from comparator 25 and Divider 28 at the $48^{th}$ nanosecond (6×8) of each 72 nanosecond period; comparator 30 provides a time displaced pulse during every 72 nd nanosecond period, and each time displaced pulse $P_{td}$ occurs 3 nanoseconds [(6×8) + (3×9) = 75] later in time than a reference pulse Pr. Namely, reference pulses Pr occur on the $0^{th}$, $72^{nd}$, $144^{th}$, $216^{th}$, $288^{th}$, $360^{th}$- - - - etc. - - - - nanosecond in elapsed time, and time displaced pulses $P_{td}$ will occur on the 3rd, $75^{th}$, $147^{th}$, $219^{th}$, $291^{st}$, $363^{nd}$ - - - etc. - - - nanosecond in elapsed time.

Again referring to Equation No. 1, supra, it is to be noted that (6×8) + (3×9) = 75 and 75−72=3, 0+75=75, 72+75=147, 144+75=219, 216+75=291 - - - - etc. - - - - - .

From the above four examples, it will be seen, that as the count (binary quantity) impressed on the selector terminals of comparator 25 is decreased by 1 and the count (binary quantity) impressed on the selector terminals of comparator 30 is increased by 1, the time displacement between the reference pulse Pr and the time displaced pulses $P_{td}$ will be increased by 1 nanosecond. The above rule will be further evident and conclusively established from the following table, TABLE No. 1, and the further detailed description, with reference to Waveforms of the drawing, set-forth hereinafter.

TABLE NO. 1

| COMPARATOR 25 Binary Quantity (count) impressed on Selector terminals 25-1, 25-2, 25-4 and 25-8 | COMPARATOR 30 Binary Quantity (count) impressed on Selector terminals 30-1, 30-2 and 30-8 | Pr, reference pulses, time occurrence in nanoseconds | (See Figure 2) $P_{td}$, time displaced pulses, time occurrence in nanoseconds | Time displacement between reference pulses Pr and time displaced pulses $P_{td}$ |
|---|---|---|---|---|
| 0000 (0) | 000 (0) | 0,72,144 216, 288, 360, — | 0,72,144 216, 288, 360, — | 0 |
| 0001 (8) | 100 (1) | '' | 1,73,145 217, 289 361, — | 1 |
| 1110 (7) | 010 (2) | '' | 2,74,146, 218, 290, 362, — | 2 |
| 0110 (6) | 110 (3) | '' | 3,75,147, 219, 291, 363, — | 3 |
| 1010 (5) | 001 (4) | '' | 4,76,148, 220, 292, 364, — | 4 |
| 0010 (4) | 101 (5) | '' | 5,77,149, 221, 293, 365, — | 5 |
| 1100 (3) | 011 (6) | '' | 6,78,150, 222, 294, 366, — | 6 |
| 0100 (2) | 111 (7) | '' | 7,79,151 223, 295 367, — | 7 |
| | | | 8,80,152 | |

TABLE NO. 1 –Continued

| COMPARATOR 25 Binary Quantity (count) impressed on Selector terminals 25-1, 25-2, 25-4 and 25-8 | COMPARATOR 30 Binary Quantity (count) impressed on Selector terminals 30-1, 30-2 and 30-8 | Pr, reference pulses, time occurrence in nanoseconds | (See Figure 2) $P_{td}$, time displaced pulses, time occurrence in nanoseconds | Time displacement between reference pulses Pr and time displaced pulses $P_{td}$ |
|---|---|---|---|---|
| 1000 (1) | 000 (0) | " | 224, 296, 368, — | 8 |
| 0000 (0) | 100 (1) | " | 9,81,153, 225, 297 369, — | 9 |
| 0001 (8) | 010 (2) | " | 10,82,154, 226, 298 370, — | 10 |
| 1110 (7) | 110 (3) | " | 11,83,155 227, 299, 371, — | 11 |
| 0110 (6) | 001 (4) | " | 12,84,156, 228, 300 372, — | 12 |
| 1010 (5) | 101 (5) | " | 13,85,157, 229, 301, 373, — | 13 |
| 0010 (4) | 011 (6) | " | 14,86,158, 230, 302, 374, — | 14 |
| 1100 (3) | 111 (7) | " | 15,87,159, 231, 303, 375, — | 15 |
| 0100 (2) | 000 (0) | " | 16,88,160, 232,304, 376, — | 16 |
| 1000 (1) | 100 (1) | " | 17,89,161, 233, 305, 377, — | 17 |
| 0000 (0) | 010 (2) | " | 18,90,162, 234, 306, 378, — | 18 |
| 0001 (8) | 110 (3) | " | 19,91,163, 235, 307, 379, — | 19 |
| 1110 (7) | 001 (4) | " | 20,92,164, 236, 308, 380, — | |

From Table No. 1, it is seen that as the count associated with the Stable clocks means is counted down from 0, 8, 7, 6, 5, 4, 3, 2, 1, 0, 8, 7, 6, 5, - - - - - , in unison with the count associated with the controlled clock means being counted up from 0, 1, 2, 3, 4, 5, 6, 7, 0, 1, 2, 3, 4, 5, - - - - -, the time displacement between the references pulses Pr and the time displaced pulses $P_{td}$ will progressively increase. As set-forth in Table No. 1 the time displacement of the time displaced pluses $P_{td}$ with respect to the reference pulses $P_r$ is in nanosecond increments. As seen from Table No. 1, the time displacement is as follows: 0, 1, 2, 3, 4, 5, 6, 7, 8, 9, 10, 11, 12, 13, 14, - - - - - -. It is apparent that the above progression may be continued, whereby any time displacement in an integer number of nanoseconds from 0 through 71 may be programmed. Namely, the time displacement between the reference pulses Pr and the time displaced pulses $P_{td}$ may be selected to be any integer number of nanoseconds from 0 through 71.

Referring to FIG. 2, a further feature of applicants' invention will be explained. Referring to the structure bearing reference character 31, means is provided whereby a single binary word will be employed to select any integer number of nanoseconds of time displacement, from 0 through 71, between the reference pulses Pr and the time displaced pulses $P_{td}$. For this purpose applicants have found particularly advantageous the employment of a Field Programmable Read-Only Memory (ROM) 31. Read-Only Memories are well-known to the art and no detailed discussion thereof is deemed necessary. For Foor convenience of explanation, consider the ROM 31 to have at least 72 storage positions, each capable of storing a binary word having four binary bits. Further, consider that each storage position of the ROM may be addressed by a discrete seven binary bit word. Now, still referring to FIG. 2, it will be seen that ROM 31 has four output terminals $Q_1$, $Q_2$, $Q_4$ and $Q_8$ and seven ROM addressing terminals $A_0$, $A_1$, $A_2$, $A_3$, $A_4$, $A_5$ and $A_6$. From FIG. 2, it will be seen that ROM output terminals $Q_1$, $Q_2$, $Q_4$ and $Q_8$ are respectively connected to selector terminals 25-1, 25-2, 25-4 and 25-8 of comparator 25. Also the three low order binary addressing terminals namely $A_0$, $A_1$ and $A_2$ are respectively connected via leads $a_1$, $a_2$ and $a_4$ to selector terminals 30-1, 30-2 and 30-4 of comparator 30.

Reference is made to Table No. 2, hereinafter, and FIG. 11 of the drawings. As will be seen from Table 2, the ROM storage addresses 0000000 (0) through 1110001 (71) respectively provide to the selector terminals of comparators 25 and 30, respectively, the binary quantity or count required for integer nanosecond delays of from 0 through 71. For example, the application of the binary word 0011000 (12) on ROM address terminals ($A_0$ ---$A_6$) results in the reading of the binary quantity, or word, 0110 from storage in the ROM. The binary word 0110 is applied via ROM output terminals to the selector terminals of comparator 25. As seen from FIG. 2, and Table 2, concurrently with the read-out of a binary quantity from the ROM, the three lowest orders of the ROM address are applied via leads $a_1$, $a_2$ and $a_4$ to the selector terminals of comparator 30. Thus as seen from Table 2, the application of the ROM address 0011000 to the ROM address terminals ($A_0$---$A_6$) results in (1) a binary count of 0110 (6) being applied to the selector terminals of comparator 25 (II) a binary count of 001 (4) being applied to the selector terminals of comparator 30, and (III) time displaced pulses $P_{td}$, respectively displaced in time twelve nanoseconds with respect to the reference pulses Pr.

Correspondingly, as seen from Table 2, the application of the ROM address 0110001 (70) to the ROM address terminals ($A_0$---$A_6$) results in (I) a binary count of 0100 (2) being applied to the selector terminals of comparator 25, (II) a binary count of 011 (6) being applied to the selector terminals of comparator 30, and (III) time displaced pulses $P_{td}$, respectively, displaced in time seventy nanoseconds with respective to the reference pulses Pr.

Figure 11:
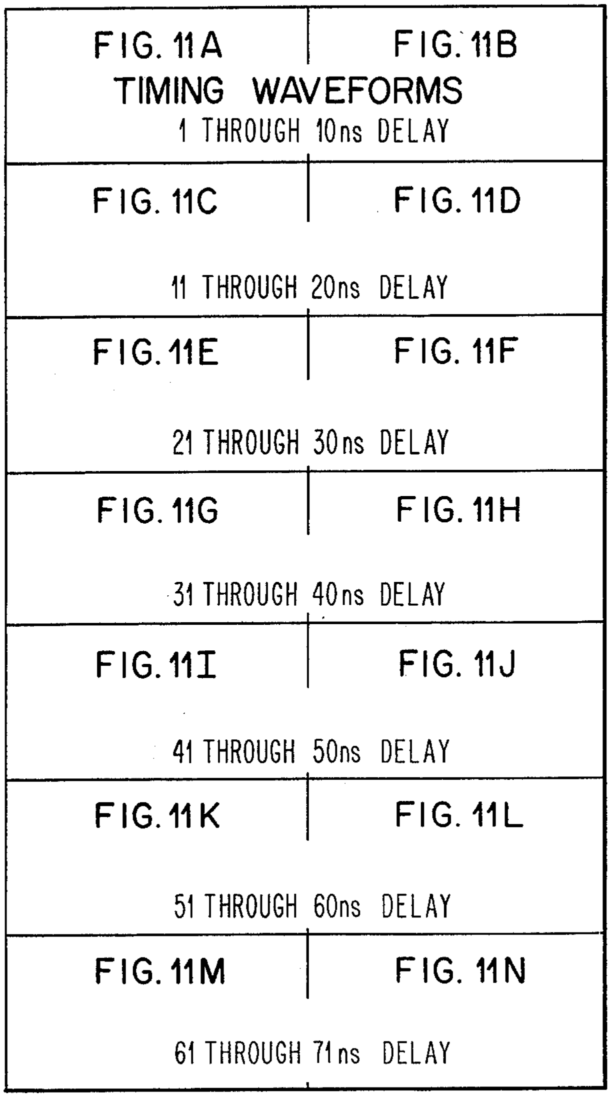
FIGS. 11A through 11N, placed together as shown in FIG. 11, disclose waveforms to be viewed in conjunction with the description and examples of the operation preferred embodiment of the invention.

From the foregoing detailed description, and with reference Table 2, FIG. 2 and FIG. 11, it is evident that the application of any integer number from 0 through 71 applied to terminals $A_0$, $A_1$, $A_2$, $A_3$, $A_4$, $A_5$ and $A_6$ will result in a like number of nanoseconds delay.

Figure 11A:
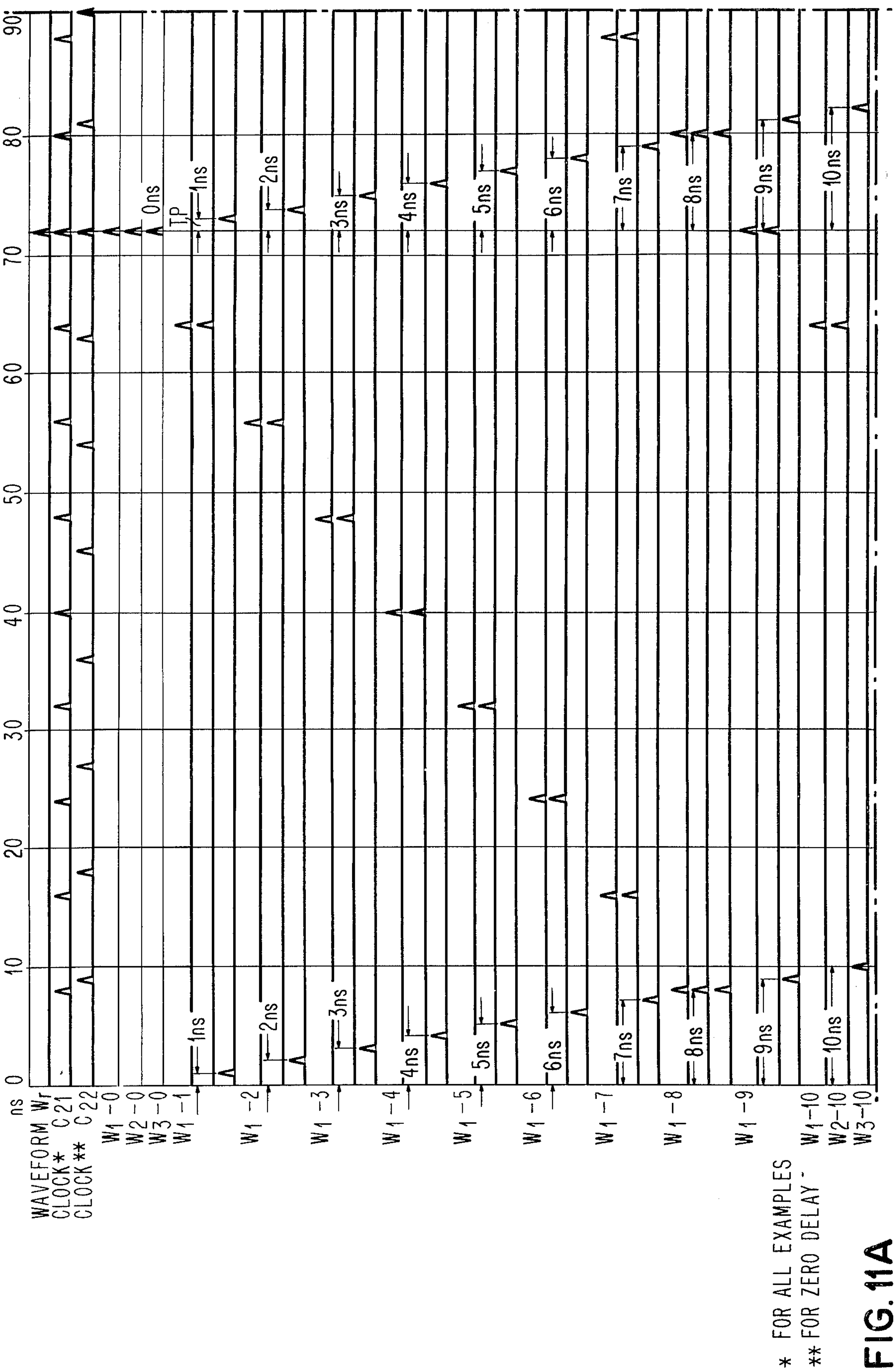
Figure 11B:
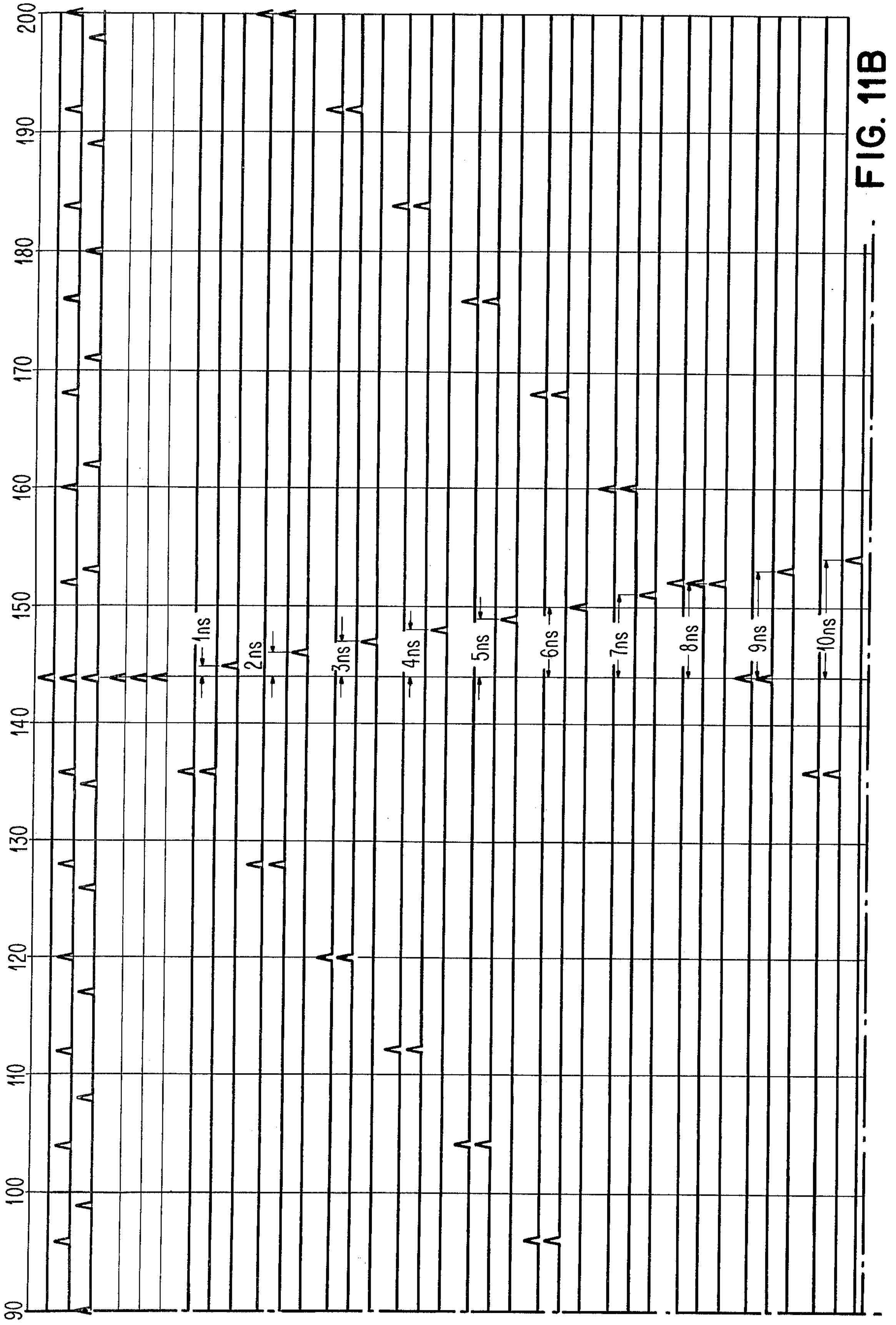
Figure 11C:
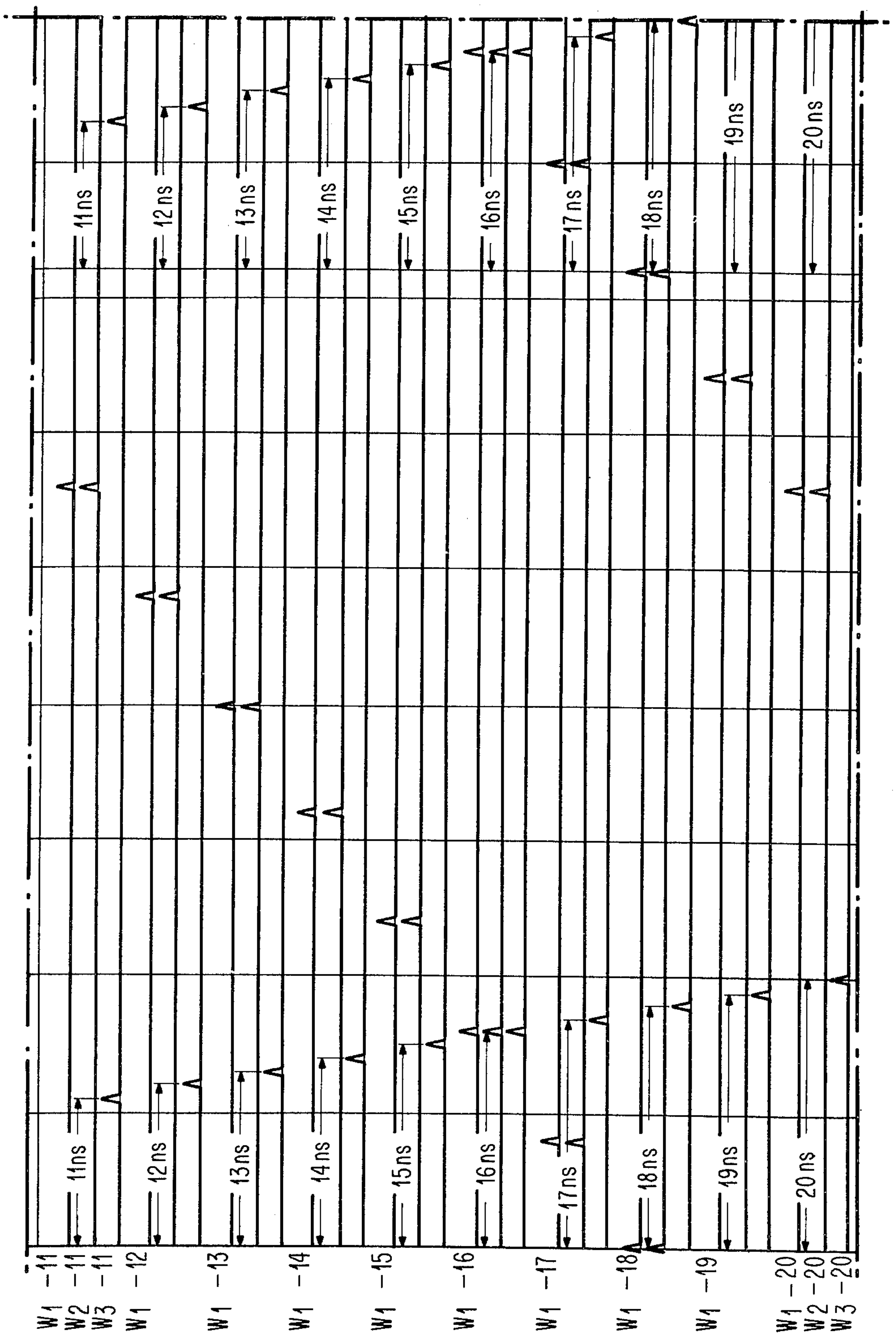
Figure 11D:
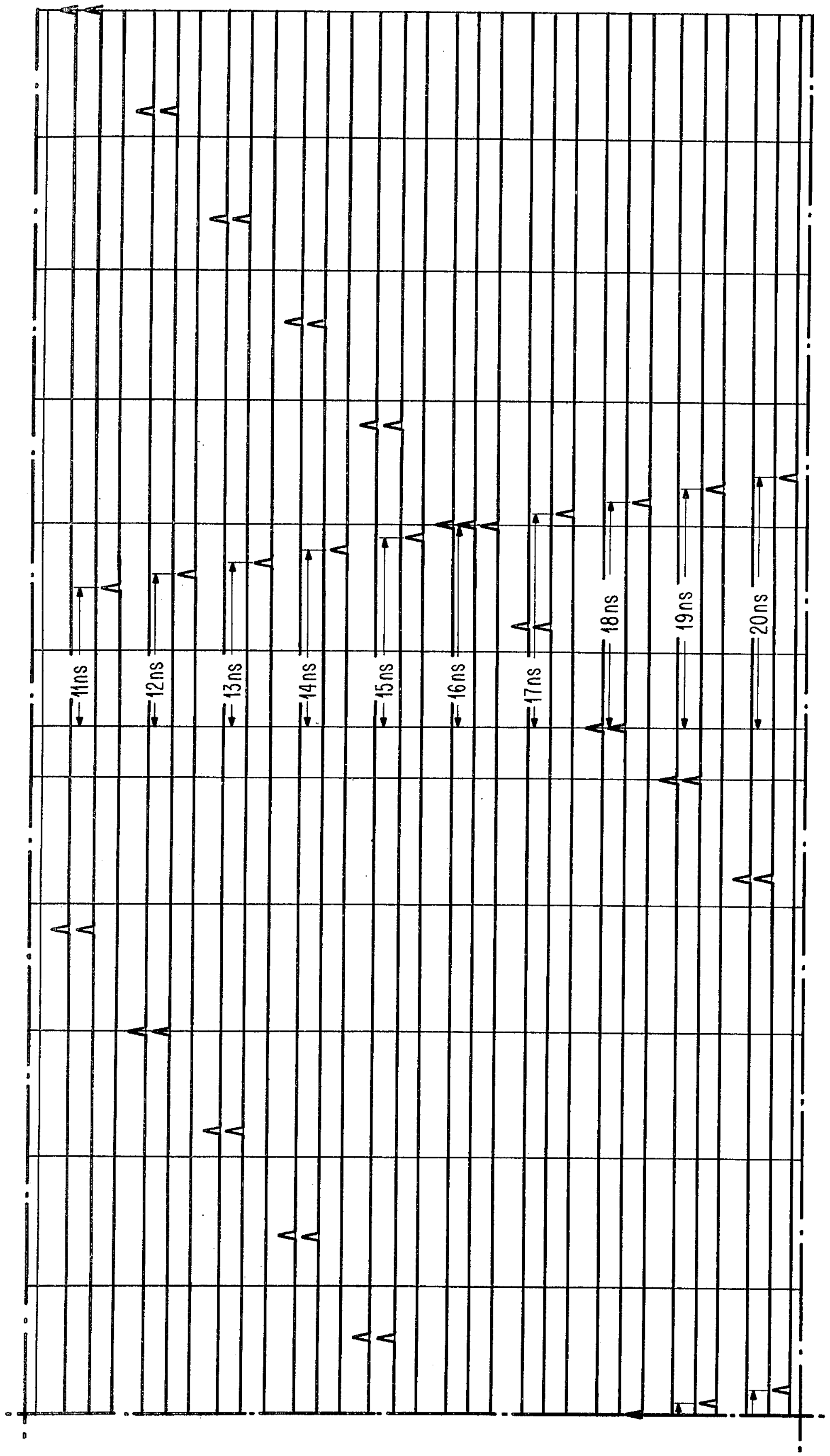
Figure 11E:
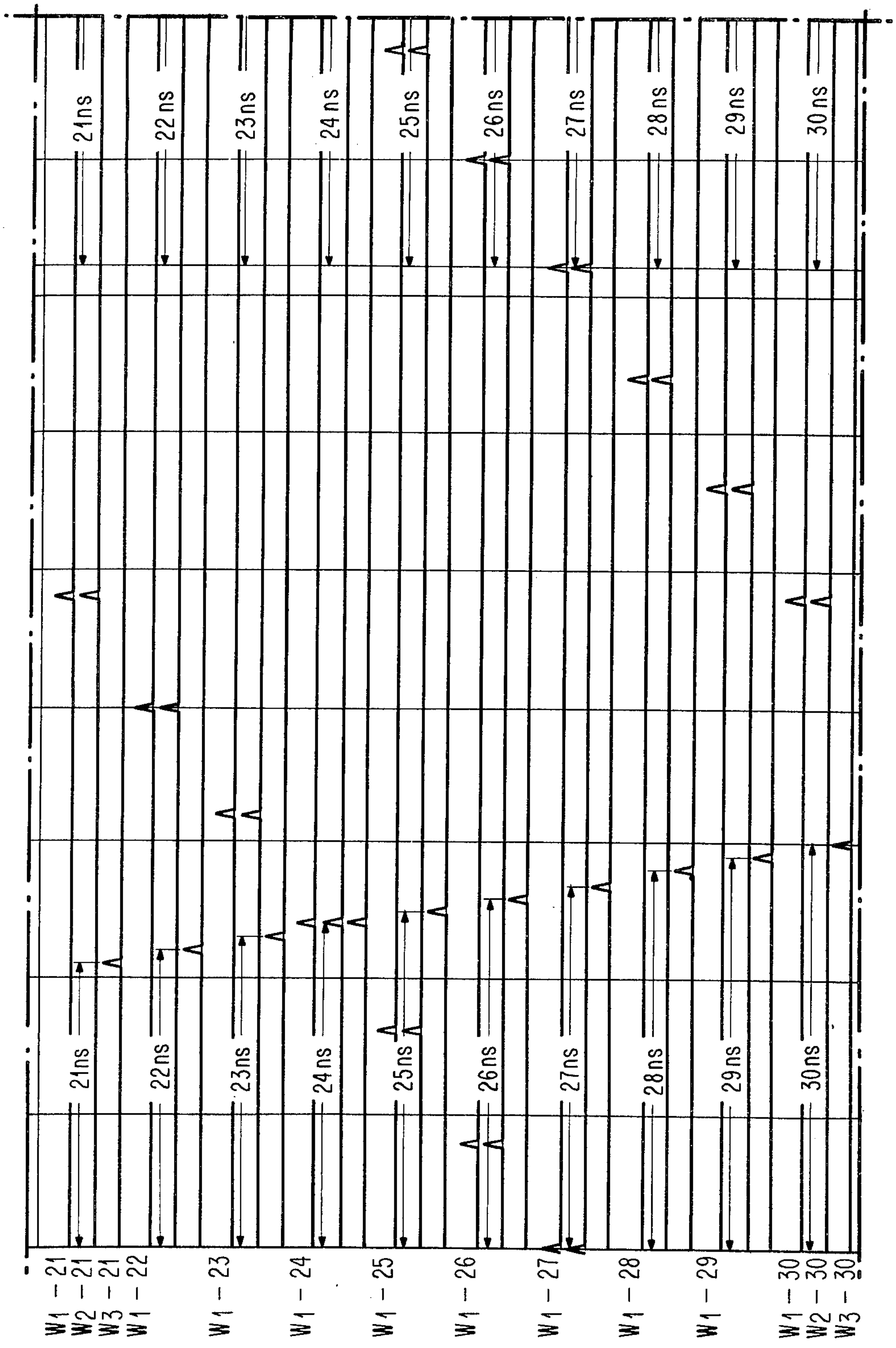
Figure 11F:
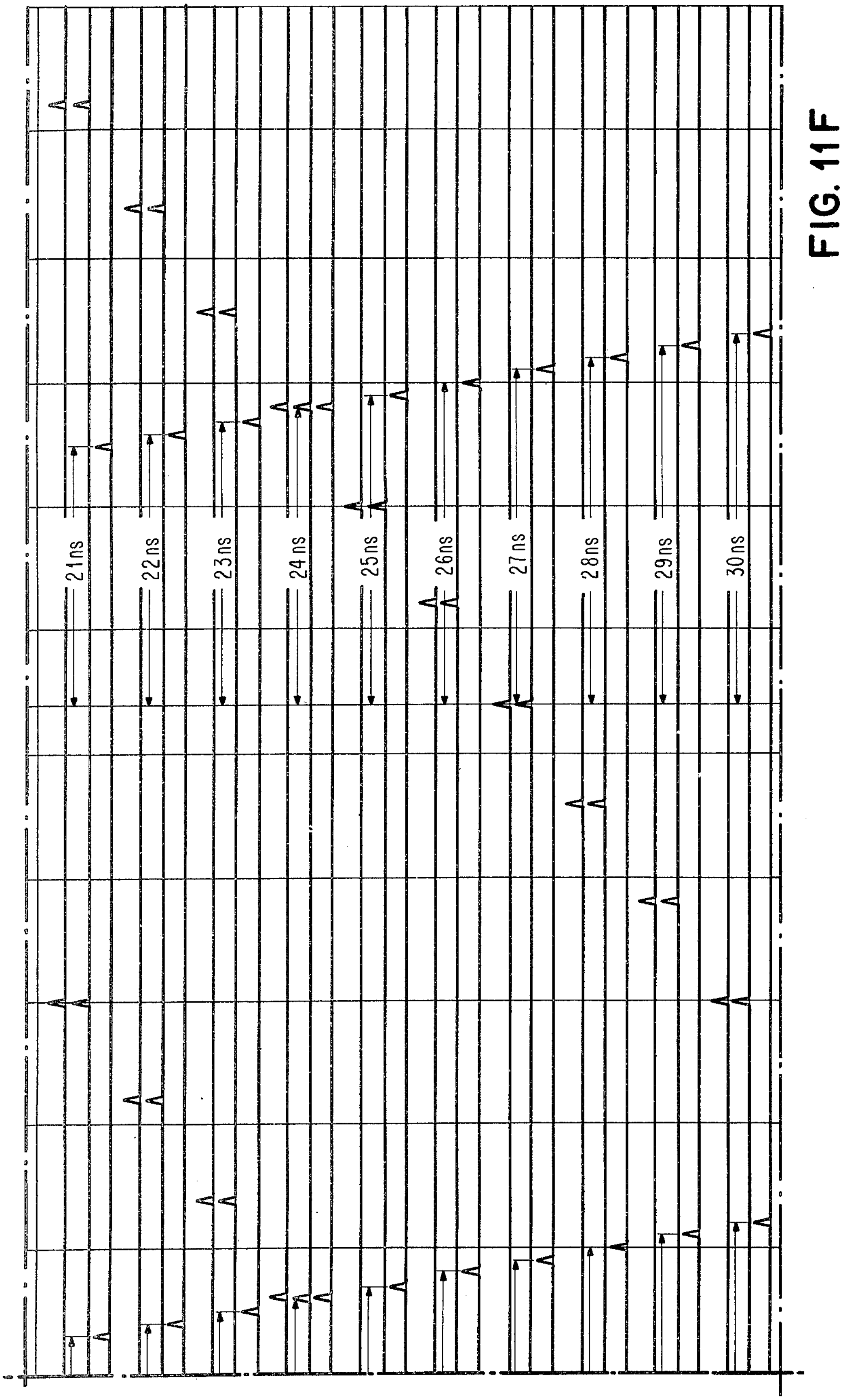
Figure 11G:
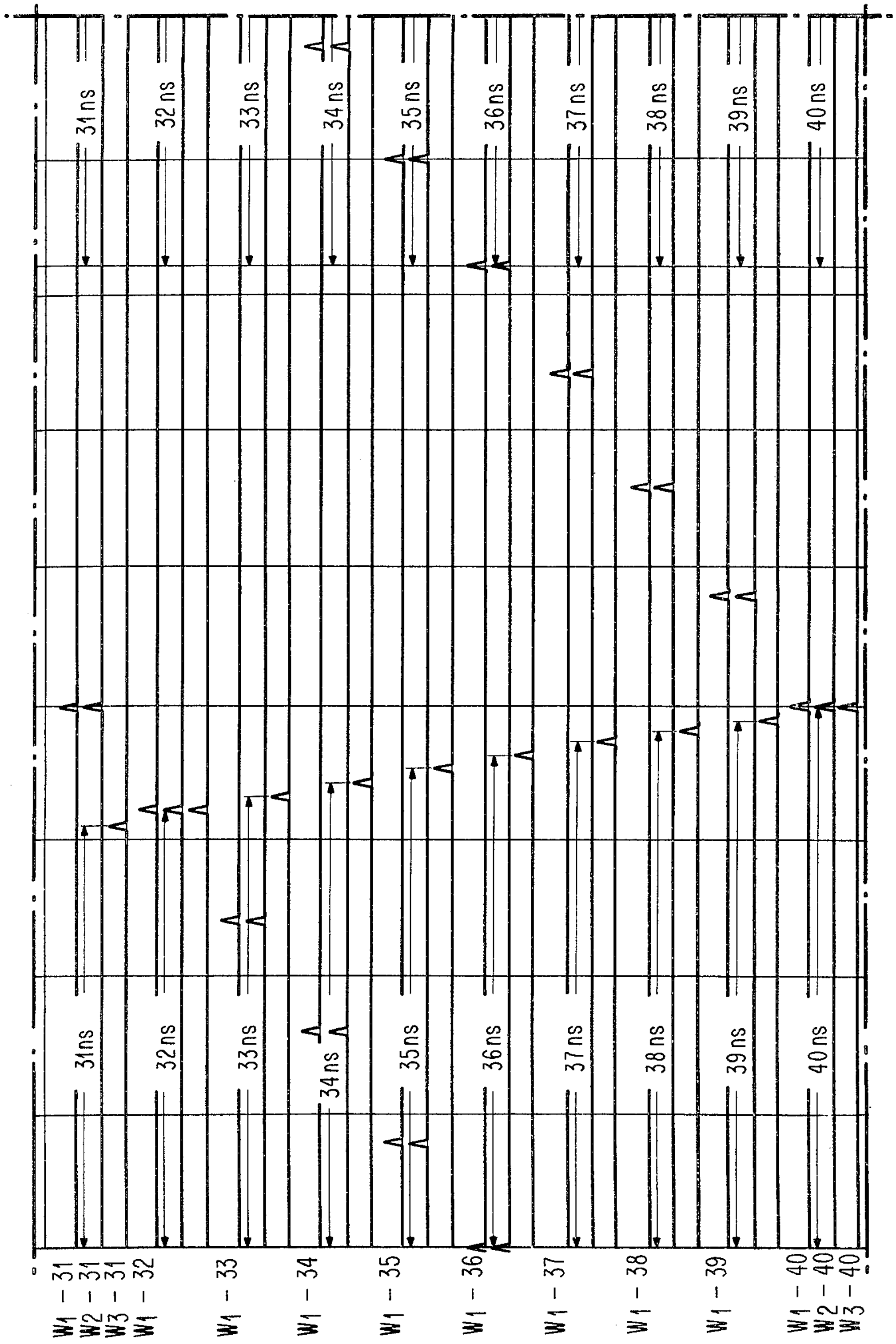
Figure 11H:
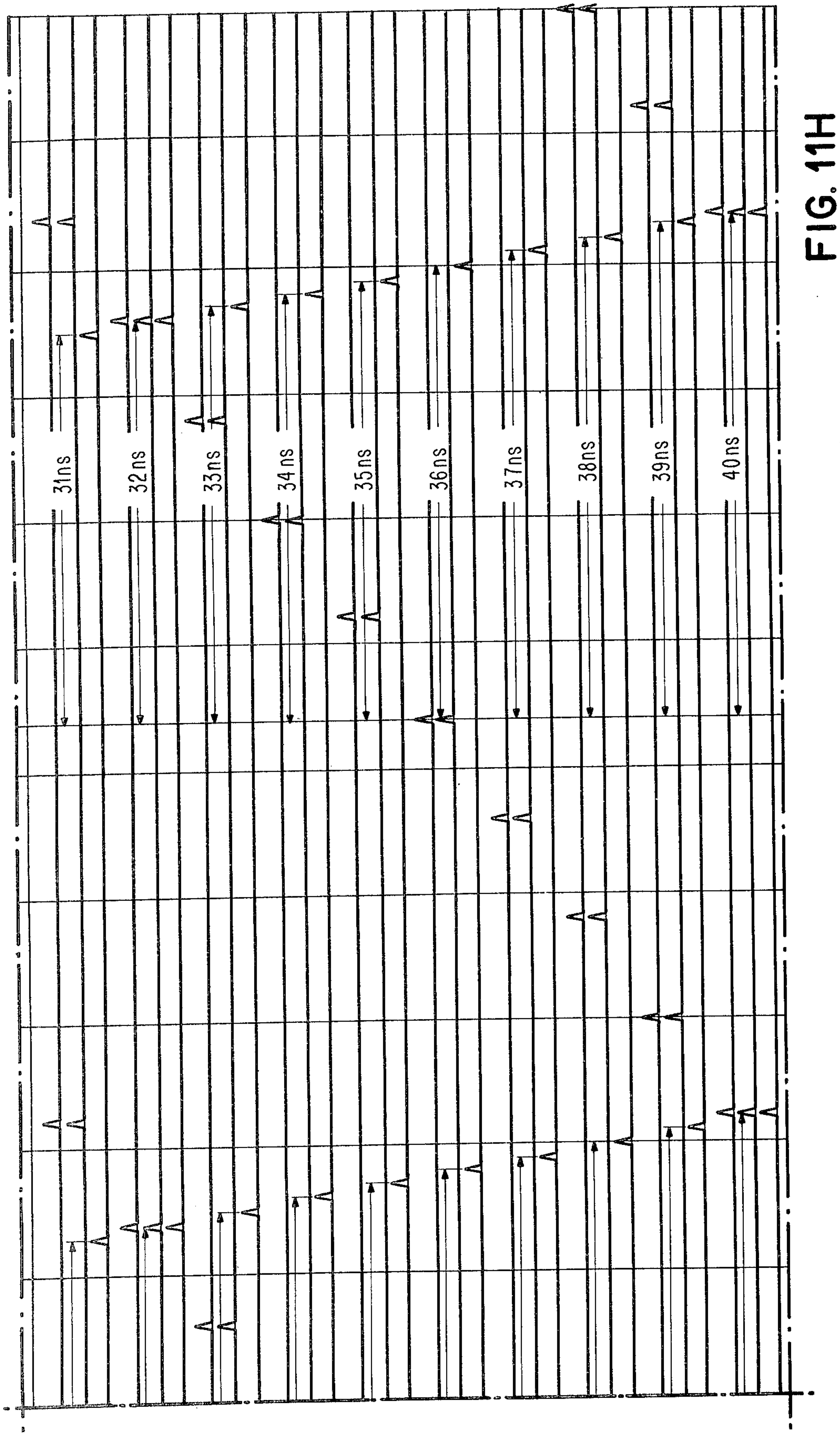
Figure 11I:
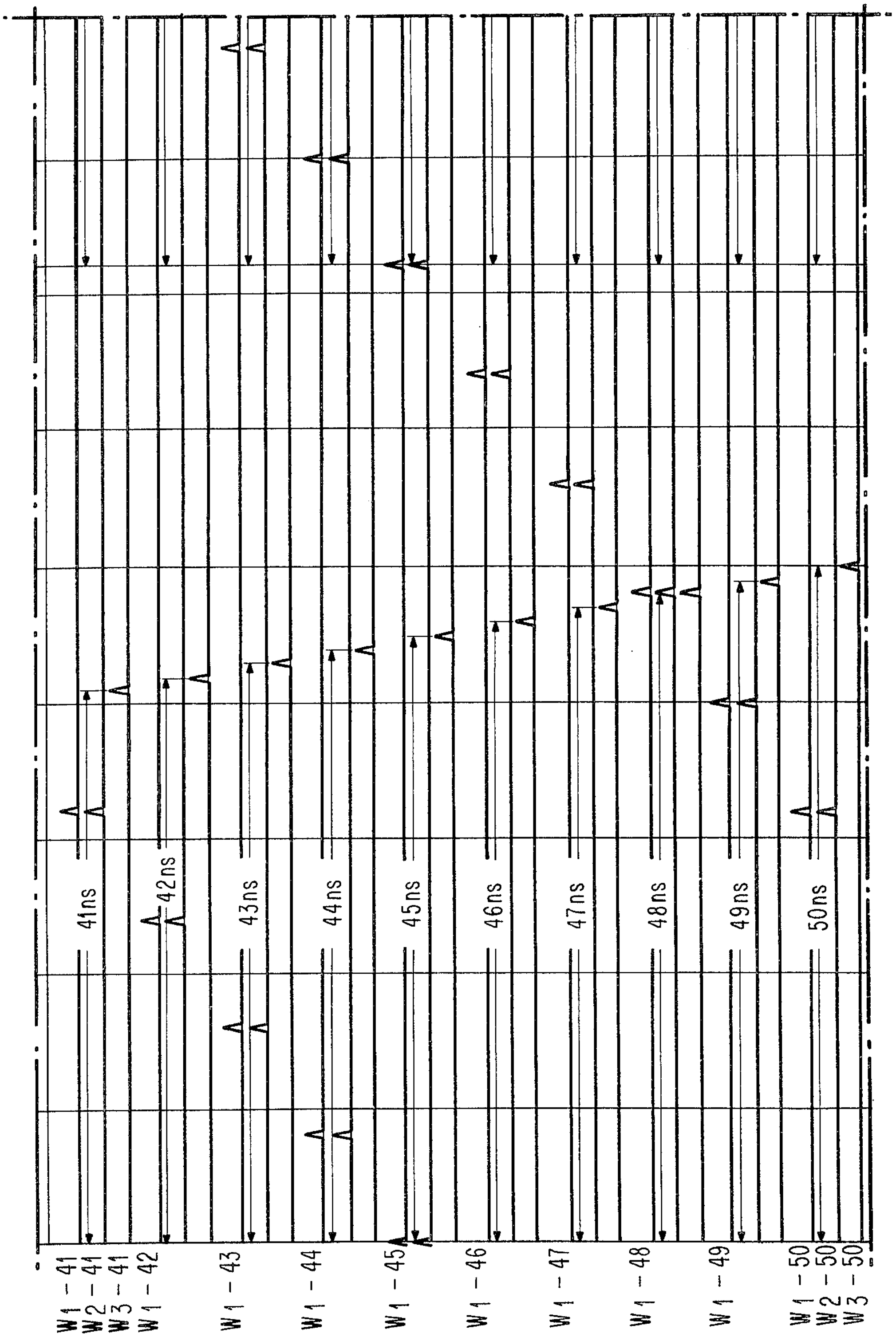
Figure 11J:
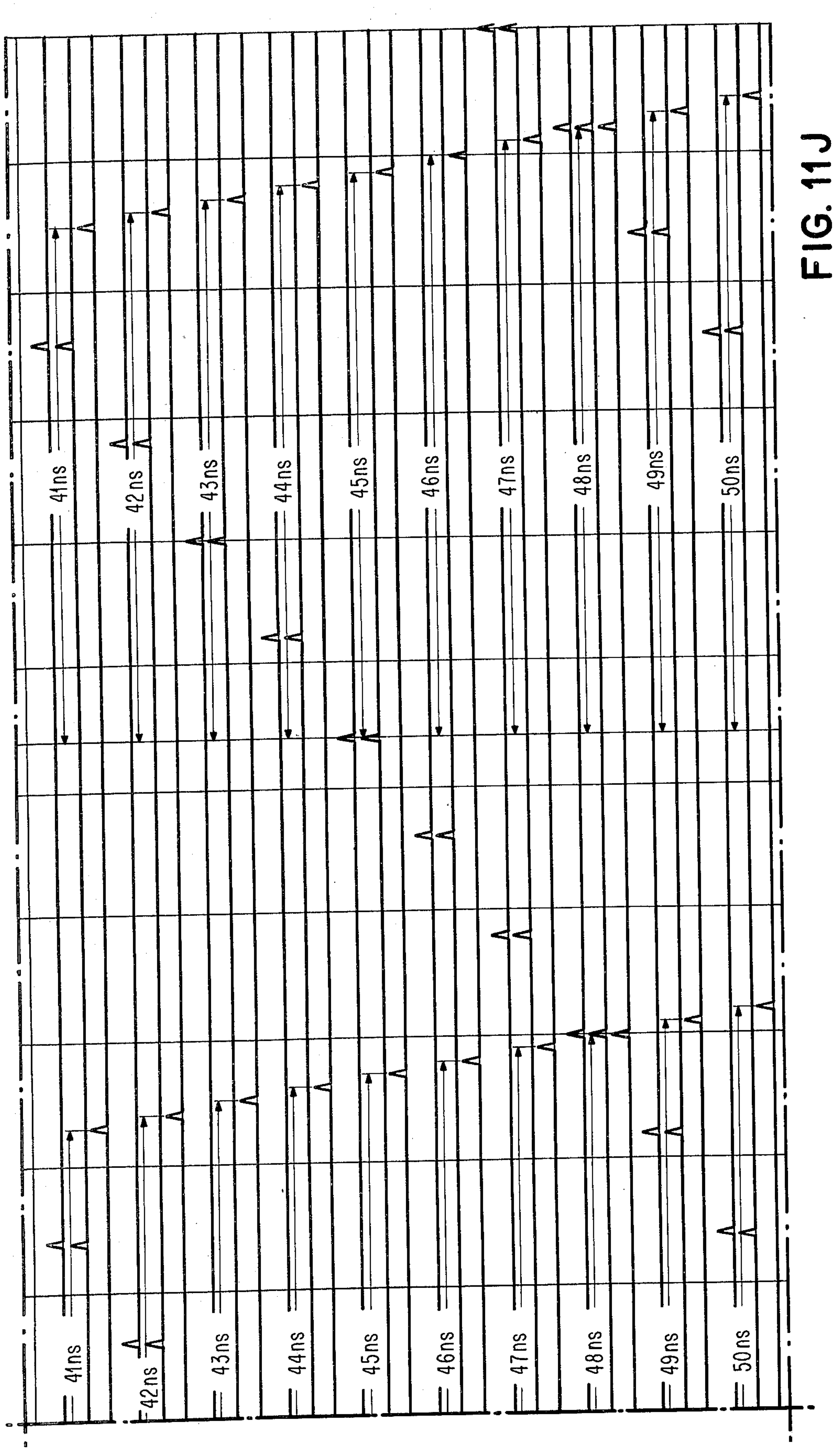
Figure 11K:
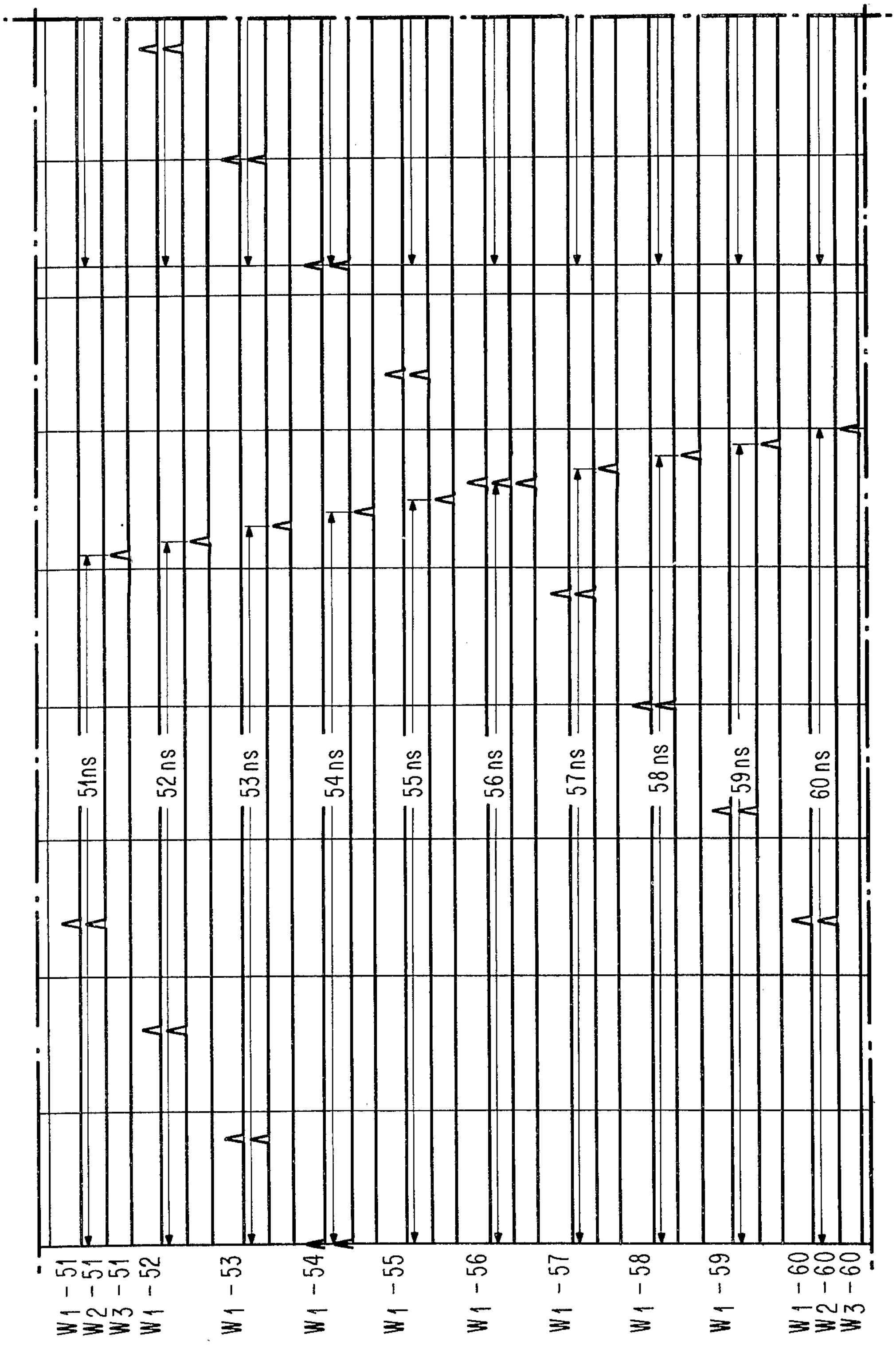
Figure 11L:
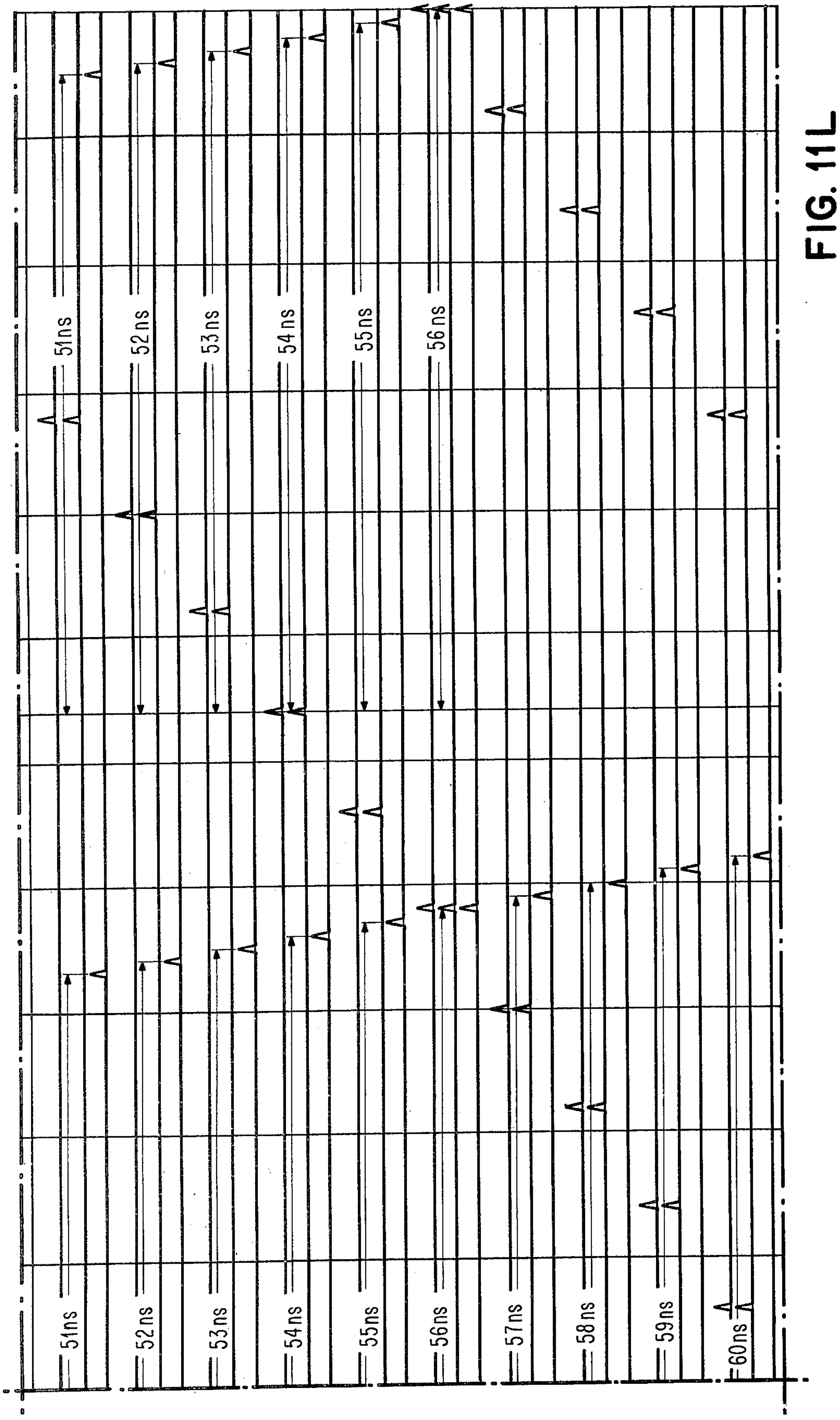
Figure 11M:
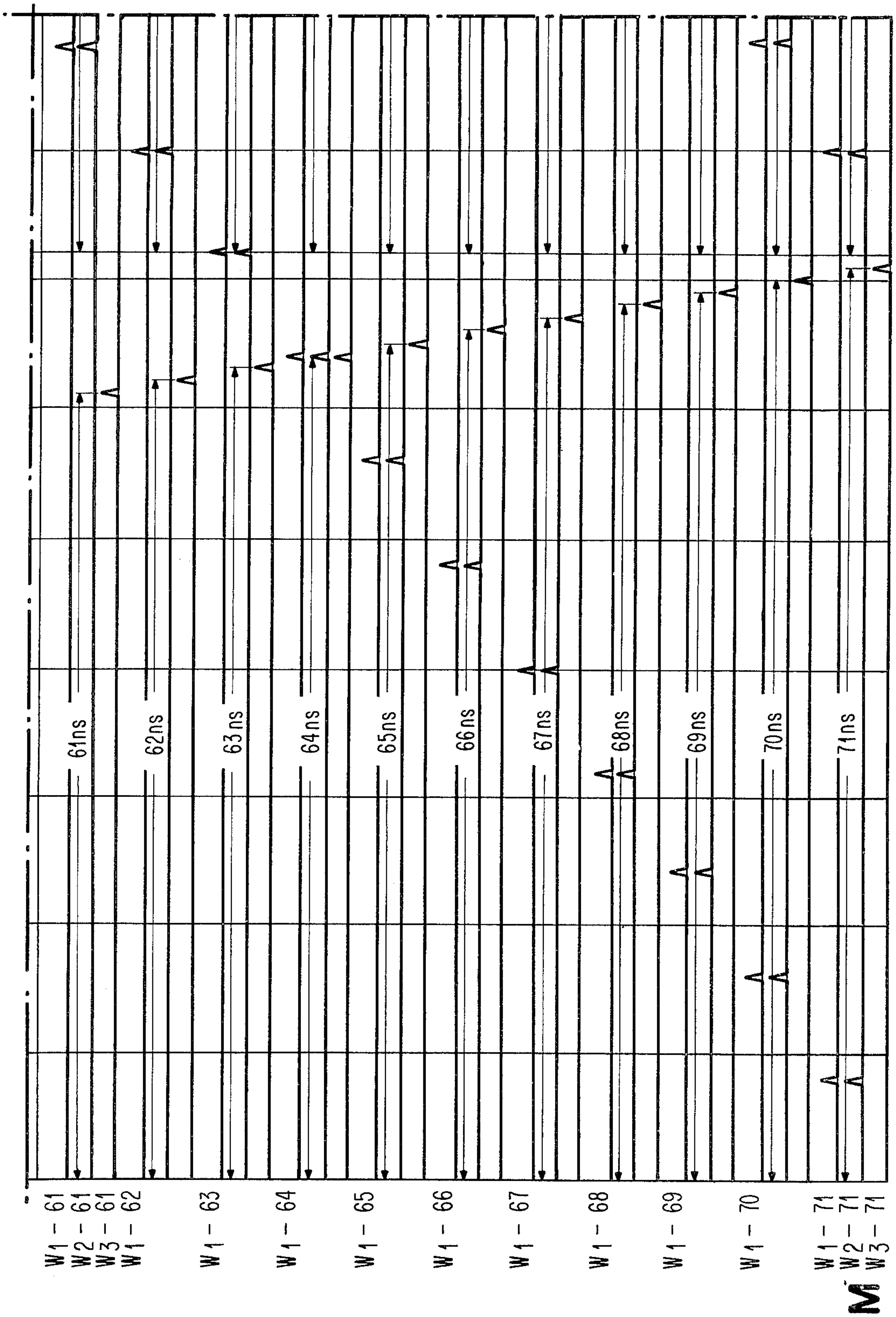
Figure 11N:
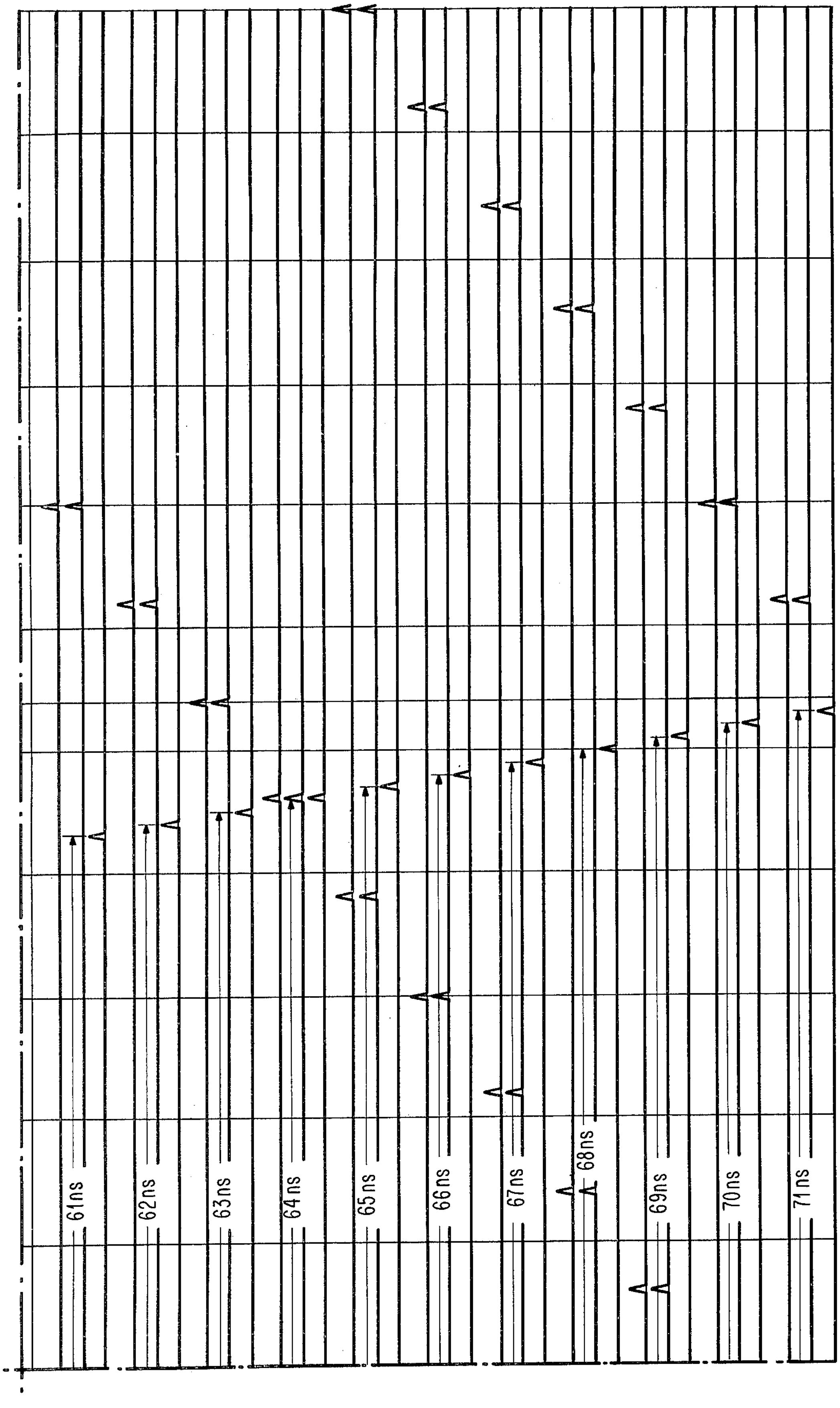

FIG. 11 of the drawing is a composite comprised of FIGS. 11A through 11N. When FIGS. 11A through 11N are respectively placed together as shown in FIG. 11, selected waveforms forms for each of the 0 through 71, nanosecond periods of delay are represented.

TABLE NO. 2

(Reference is made to Figures 2 and 11)

| ROM Address $A_0$, $A_1$, $A_2$, $A_3$, $A_4$, $A_5$, $A_6$ | Comparator 25 Binary Quantity (count) impressed on Selector terminals 25-1, 25-2, 25-4 and 25-8 | Comparator 30 Binary Quantity (count) impressed on Selector terminals 30-1, 30-2, 30-4 and 30-8 | Pr, reference pulses, time occurrence in nanoseconds | $P_{td}$, time displaced pulses, time occurrence in nanoseconds | Waveforms Figure 11 | Time displacement between $P_r$ and $P_{td}$, in nanoseconds |
|---|---|---|---|---|---|---|
| 0000000(0) | 0000 (0) | 000 (0) | 0,72,144,216 288,360,432, — | 0,72,144,216 288,360,432, — | $W_r$,$W_{1-0}$, $W_{2-0}$, $W_{3-0}$ | 0 |
| 1000000(1) | 0001 (8) | 100 (1) | " | 1,73,145,217, 289,361,433 | $W_r$, $W_{1-1}$, $W_{2-1}$, $W_{3-1}$ | 1 |
| 0100000(2) | 1110 (7) | 010 (2) | " | 2,74,146,218, 290,362,434 | $W_r$,$W_{1-2}$, $W_{2-2}$, $W_{3-2}$ | 2 |
| 1100000(3) | 0110 (6) | 110 (3) | " | 3,75,147,219, 291,363,435 | $W_r$,$W_{1-3}$, $W_{2-3}$, $W_{3-3}$ | 3 |
| 0010000(4) | 1010 (5) | 001 (4) | " | 4,76,148,220, 292,374,436 | $W_r$,$W_{1-4}$, $W_{2-4}$, $W_{3-4}$ | 4 |
| 1010000(5) | 0010 (4) | 101 (5) | " | 5,77,149,221, 293,365,437 | $W_r$,$W_{1-5}$, $W_{2-5}$, $W_{3-5}$ | 5 |
| 0110000(6) | 1100 (3) | 011 (6) | " | ' | $W_r$,$W_{1-6}$, $W_{2-6}$, $W_{3-6}$ | 6 |
| 1110000(7) | 0100 (2) | 111 (7) | " | ' | $W_r$, $W_{1-7}$, $W_{2-7}$, $W_{3-7}$ | 7 |
| 0001000(8) | 1000 (1) | 000 (0) | " | ' | $W_r$, $W_{1-8}$, $W_{2-8}$, $W_{3-8}$ | 8 |
| 1001000(9) | 0000 (0) | 100 (1) | " | ' | $W_r$, $W_{1-9}$, $W_{2-9}$, $W_{3-9}$ | 9 |
| 0101000(10) | 0001 (8) | 010 (2) | " | ' | $W_r$, $W_{1-10}$, $W_{2-10}$, $W_{3-10}$ | 10 |
| 1101000(11) | 1110(7) | 110 (3) | " | ' | ' | 11 |
| 0011000(12) | 0110 (6) | 001 (4) | " | ' | ' | 12 |
| 1011000(13) | 1010 (5) | 101 (5) | " | ' | ' | 13 |
| 0111000(14) | 0010 (4) | 011 (6) | " | ' | ' | 14 |
| 1111000(15) | 1100 (3) | 111 (7) | " | ' | ' | 15 |
| 0000100(16) | 0100 (2) | 000 (0) | " | ' | ' | 16 |
| 1000100(17) | 1000 (1) | 100 (1) | " | ' | ' | 17 |
| 0100100(18) | 0000 (0) | 010 (2) | " | ' | ' | 18 |
| 1100100(19) | 0001 (8) | 110 (3) | " | ' | ' | 19 |
| 0010100(20) | 1110 (7) | 001 (4) | " | 20,92,164,236, 308,380,452 | $W_r$, $W_{1-20}$, $W_{2-20}$, $W_{3-20}$ | 20 |
| 1010100(21) | 0110 (6) | 101 (5) | " | 21,93,165,237, 309,381,453 | $W_r$, $W_{1-21}$, $W_{2-21}$, $W_{3-21}$ | 21 |
| 0110100(22) | 1010 (5) | 011 (6) | " | 22,94,166,238, 310, 382, 454 | $W_r$, $W_{1-22}$, $W_{2-22}$, $W_{3-22}$ | 22 |
| 1110100(23) | 0010 (4) | 111 (7) | " | ' | ' | 23 |
| 0001100(24) | 1100 (3) | 000 (0) | " | ' | ' | 24 |
| 1001100(25) | 0100 (2) | 100 (1) | " | ' | ' | 25 |
| 0101100(26) | 1000 (1) | 010 (2) | " | ' | ' | 26 |
| 1101100(27) | 0000 (0) | 110 (3) | " | ' | ' | 27 |
| 0011100(28) | 0001 (8) | 001 (4) | " | ' | ' | 28 |
| 1011100(29) | 1110 (7) | 101 (5) | " | ' | ' | 29 |
| 0111100(30) | 0110 (6) | 011 (6) | " | ' | ' | 30 |
| 1111100(31) | 1010 (5) | 111 (7) | " | ' | ' | 31 |
| 0000010(32) | 0010 (4) | 000 (0) | " | ' | ' | 32 |
| 1000010(33) | 1100 (3) | 100 (1) | " | ' | ' | 33 |
| 0100010(34) | 0100 (2) | 010 (2) | " | ' | ' | 34 |
| 1100010(35) | 1000 (1) | 110 (3) | " | ' | ' | 35 |
| 0010010(36) | 0000 (0) | 001 (4) | " | ' | ' | 36 |
| 1010010(37) | 0001 (8) | 101 (5) | " | ' | ' | 37 |
| 0110010(38) | 1110 (7) | 011 (6) | " | ' | ' | 38 |
| 1110010(39) | 0110 (6) | 111 (7) | " | ' | ' | 39 |
| 0001010(40) | 1010 (5) | 000 (0) | " | ' | ' | 40 |
| 1001010(41) | 0010 (4) | 100 (1) | " | 41,113,185,257, 329, 401, 473 | $W_r$, $W_{1-41}$, $W_{2-41}$, $W_{3-41}$ | 41 |
| 0101010(42) | 1100 (3) | 010 (2) | " | 42,114,186,258, 330, 402, 474 | $W_r$, $W_{1-42}$, $W_{2-42}$, $W_{3-42}$ | 42 |
| 1101010(43) | 0100 (2) | 110 (3) | " | 43,115,187,259, 331, 403, 475 | $W_r$, $W_{1-43}$ $W_{2-43}$, $W_{3-43}$ | 43 |

TABLE NO. 2 –Continued (Reference is made to Figures 2 and 11)

| ROM Address $A_0$, $A_1$, $A_2$, $A_3$, $A_4$, $A_5$, $A_6$ | Comparator 25 Binary Quantity (count) impressed on Selector terminals 25-1, 25-2, 25-4 and 25-8 | Comparator 30 Binary Quantity (count) impressed on Selector terminals 30-1, 30-2, 30-4 and 30-8 | Pr, reference pulses, time occurrence in nanoseconds | $P_{td}$, time displaced pulses, time occurrence in nanoseconds | Waveforms Figure 11 | Time displacement between $P_r$ and $P_{td}$, in nanoseconds |
|---|---|---|---|---|---|---|
| 0011010(44) | 1000 (1) | 001 (4) | " | ' | ' | 44 |
| 1011010(45) | 0000 (0) | 101 (5) | " | ' | ' | 45 |
| 0111010(46) | 0001 (8) | 011 (6) | " | ' | ' | 46 |
| 1111010(47) | 1110 (7) | 111 (7) | " | ' | ' | 47 |
| 0000110(48) | 0110 (6) | 000 (0) | " | ' | ' | 48 |
| 1000110(49) | 1010(5) | 100 (1) | " | ' | ' | 49 |
| 0100110(50) | 0010 (4) | 010 (2) | " | ' | ' | 50 |
| 1100110(51) | 1100 (3) | 110 (3) | " | ' | ' | 51 |
| 0010110(52) | 0100 (2) | 001 (4) | " | ' | ' | 52 |
| 1010110(53) | 1000 (1) | 101 (5) | " | ' | ' | 53 |
| 0110110(54) | 0000 (0) | 011 (6) | " | ' | ' | 54 |
| 1110110(55) | 0001 (8) | 111 (7) | " | ' | ' | 55 |
| 0001110(56) | 1110 (7) | 000 (0) | " | ' | ' | 56 |
| 1001110(57) | 0110 (6) | 100 (1) | " | ' | ' | 57 |
| 0101110(58) | 1010 (5) | 010 (2) | " | ' | ' | 58 |
| 1101110(59) | 0010 (4) | 110 (3) | " | ' | ' | 59 |
| 0011110(60) | 1100 (3) | 001 (4) | " | ' | ' | 60 |
| 1011110(61) | 0100 (2) | 101 (5) | " | ' | ' | 61 |
| 0111110(62) | 1000 (1) | 011 (6) | " | ' | ' | 62 |
| 1111110(63) | 0000 (0) | 111 (7) | " | ' | ' | 63 |
| 0000001(64) | 0001 (8) | 000 (0) | " | ' | ' | 64 |
| 1000001(65) | 1110 (7) | 100 (1) | " | 65,137,209,281, 353,425,497 | $W_r$, $W_{1-65}$, $W_{2-65}$, $W_{3-65}$ | 65 |
| 0100001(66) | 0110 (6) | 010 (2) | " | 66,138,210,282, 354,426,498 | $W_r$, $W_{1-66}$, $W_{2-66}$, $W_{3-66}$ | 66 |
| 1100001(67) | 1010 (5) | 110 (3) | " | 67,139,211,283, 355,427,499 | $W_r$, $W_{1-67}$, $W_{2-67}$, $W_{3-67}$ | 67 |
| 0010001(68) | 0010 (4) | 001 (4) | " | 68,140,212,284, 356,428,500 | $W_r$, $W_{1-68}$, $W_{2-68}$, $W_{3-68}$ | 68 |
| 1010001(69) | 1100 (3) | 101 (5) | " | 69,141,213,285, 357,429,501 | $W_r$, $W_{1-69}$, $W_{2-69}$, $W_{3-69}$ | 69 |
| 0110001(70) | 0100 (2) | 011 (6) | " | 70,142,214,286, 358,430,502 | $W_r$, $W_{1-70}$, $W_{2-70}$, $W_{3-70}$ | 70 |
| 1110001(71) | 1000 (1) | 111 (7) | " | 71,143,215,287, 359,431,503 | $W_r$, $W_{1-71}$, $W_{2-71}$, $W_{3-71}$ | 71 |

For example, referring to Table No. 2 and FIG. 11, waveforms $W_r$, depicted a single time, is applicable for each of the examples. Waveform $W_r$ is representative of the time occurrence of the reference pulses occurring on lead 23a of FIG. 2. Waveform $W_r$ is common to all 72 examples of operation recited in Table 2. Referring to Table No. 2 and FIGS. 2 and 11 of the drawing, it will be noted that waveforms $W_r$, $W_{1-10}$, $W_{2-10}$ and $W_{3-10}$ are referenced when the programmable delay of FIG. 2 is programmed to provide a 10 nanosecond delay. Waveform $W_r$ has been discussed supra. Waveform $W_{1-10}$ is the waveform depicting the output of comparator 25, as manifested on lead $W_1$ (FIG. 2), when the apparatus of FIG. 2 is programmed to produce a 10 nanosecond delay. Waveform $W_{2-10}$ is the waveform depicting the output of Divider 28, as manifested on lead $W_2$ (FIG. 2), when the apparatus of FIG. 2 is programmed to produce a ten nanosecond delay. Waveform $W_{3-10}$ depicts the time occurrence of the time displaced pulse $P_{td}$, manifested on lead $W_3$ (FIG. 2), when the apparatus of FIG. 2 is programmed to produce a pulse displaced in time 10 nanoseconds.

Similarly, waveforms $W_r$, $W_{1-20}$, $W_{2-20}$, and $W_{3-20}$ respectively, depict similar information when the programmable delay of FIG. 2 is programmed to produce a delay of 20 nanoseconds.

Referring to FIGS. 2 and 11, Table No. 2 and the detailed description supra, it will be apparent that in the illustrative embodiment, the signals to the phase detector 27, the reference pulse ($P_r$) repetition rate, and the time displaced pulse ($P_{td}$) repetition rate, are, respectively, predicated on a repeat cycle time of 72 nanoseconds ($T_1 \times M = 8 \times 9 = 72$).

Further, in order to simplify the increased program steps of 1 nanosecond each, the 9 nanosecond count, XOR 30, is increased 1 count and the 8 nanosecond count, XOR 25, is decreased 1 count. Counts are removed from the 8 nanosecond counter 24 every nine steps. The above may be conveniently accomplished by the use of a ROM 31 having all the counts for XOR 25 (counter 24) stored therein. The counts required for each counter for each programmable step of the illustrative embodiment of applicants' invention, as represented in FIG. 2, are set forth in Table No. 2.

Figure 3:
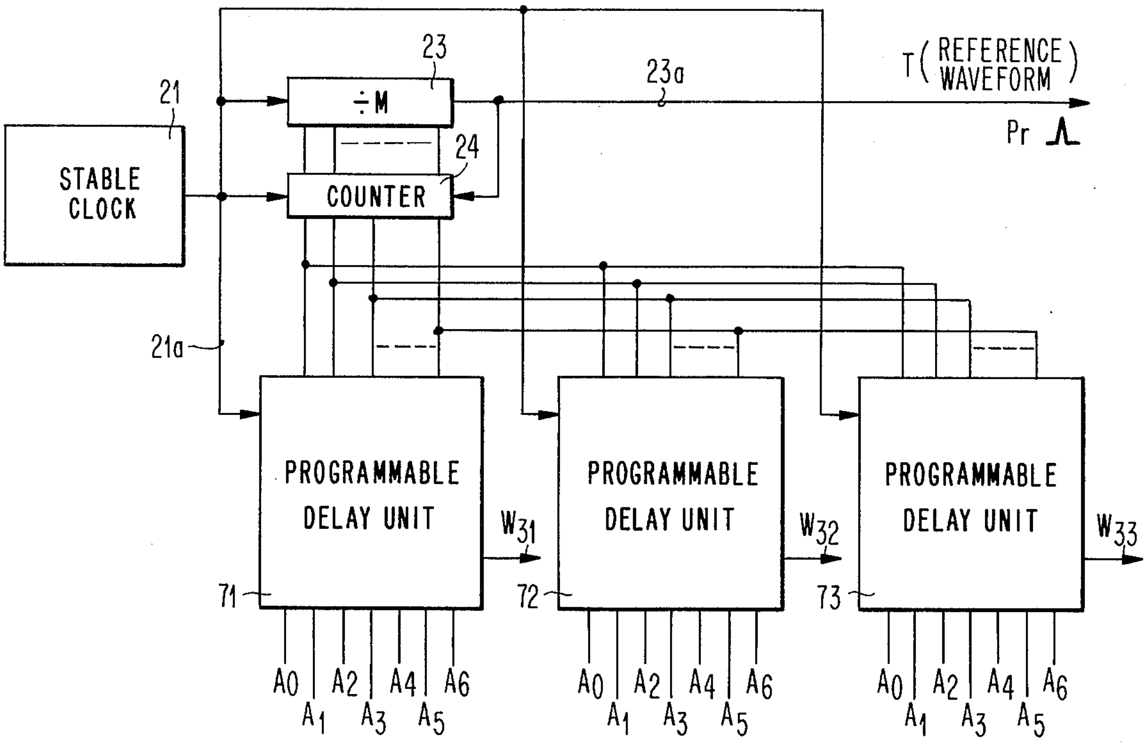
FIG. 3 is a block diagram schematically representing the preferred multi-channel embodiment of the invention.

Referring to FIG. 3, a further embodiment of applicants invention is represented. A single stable clock and associated divider 23 and counter 24 are employed with three programmable delay units 71, 72 and 73. Clock 21 provides a stable output of periodic pulses at a repetition rate of $f_s$, divider 23 provides a stable periodic pulse output at a pulse repetition rate of $fs/M$ where $M$ is an integer. Each of the Programmable Delay units 71, 72, 73 may be similar to, or identical with the Programmable Delay unit 40 shown enclosed by a broken line in FIG. 2.

Referring jointly to FIGS. 2 and 3, and referencing the detailed description of the operation of FIG. 2 infra, it will be appreciated that when each unit 71, 72 and 73 is independently programmed by the application of a discrete binary word respectively to terminals $A_0$–$A_6$ of unit 71, terminals $A_0$–$A_6$ of unit 72, and terminals $A_0$–$A_6$ of unit 73, three distinctly time displaced pulses or pulse trains will be obtained.

Merely for convenience of illustration, consider the case where M=9 the period of clock 21 is 125 MHZ, and the Programmable Delay Units 71, 72 and 73 are, respectively, identical to unit 40 of FIG. 2. Then the apparatus of FIG. 3 is three independently programmable delay units of the type shown in FIG. 2, but employing a single stable clock. Each of the three independent delay units is independently programmable to provide a delay of any integer number of nanoseconds from 0 through 71. Namely, Table No. 2 and the waveforms of FIG. 11 will be independently applicable to each of the Programmable Delay Units 71, 72 and 73.

Figure 4:
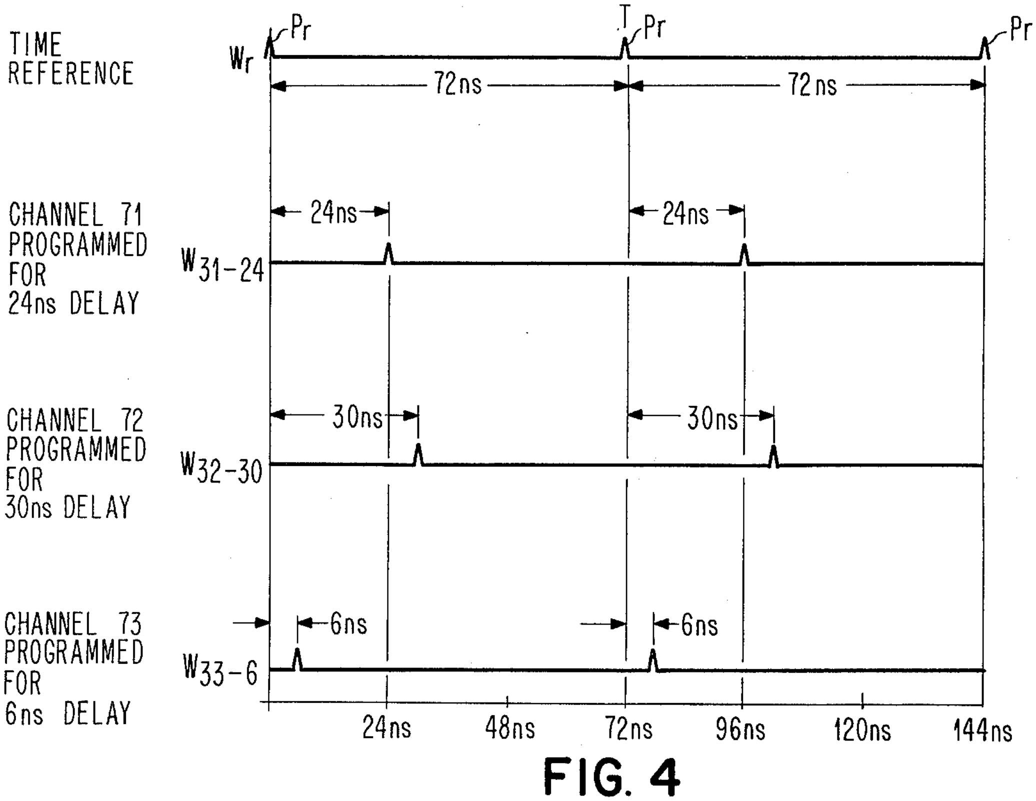
FIG. 4 discloses illustrative waveforms to be viewed in conjunction with the description of the embodiment of FIG. 3.

Referring to FIG. 4, waveform $W_r$ is the reference waveform, waveforms $W_{31\text{-}24}$, $W_{32\text{-}30}$ and $W_{33\text{-}6}$ respectively, depict the output of units 71, 72 and 73 programmed respectively, for 24, 30 and 6 nanosecond delays.

100 Pico Second Embodiment of FIG. 2

The preferred embodiment of FIG. 2 may be employed to produce smaller time increments, or resolution of T delay ($P_{td}$) relative to Reference Waveform ($P_r$). The frequency of clocks 21 and 22, the number of bits in counters 24 and 29 and comparator circuits 25 and 30 are respectively, modified.

The Stable Clock 21 is selected to be 156.25 MHZ or 6.4 nanoseconds between clock cycles. The controlled variable clock 22 is selected to be 153.84 MHZ or 6.5 nanoseconds between clock cycles. It is seen that the time increment, or net difference between the two clock cycles is 6.5 ns minus 6.4 ns. Namely, the delay between the reference pulse $P_r$ and the time displaced pulse $P_{td}$ is in increments of 0.1 nanoseconds ($0.1 \times 10^{-9}$), or 100 pico seconds ($100 \times 10^{-12}$). To obtain the 100 ps increments of T delay ($P_{td}$), the circuit structure of FIG. 2 is expanded or modified in the manner set forth below. The basic mode of operation of the preferred embodiment of FIG. 2 remains as explained earlier herein. For synchronization of the clocks operating at these frequencies, a common frequency must be obtained into the Phase Detector 27 (inputs lines W1 and W2) so that a phase and frequency lock takes place between the two clocks. This is accomplished by counting each clock cycle a prescribed number of times to reach a common frequency between the two clocks. For this embodiment, the common frequency is 2403.85 KHZ or 416 nanoseconds ($416 \times 10^{-9}$). The Stable Clock 21 is counted down by 65 ($6.4\text{ns} \times 65 = 416$ ns) and the Controlled Variable Clock 22 is counted down by 64 ($6.5$ ns $\times 64 = 416$ ns). Counter 24, Divider 23 and XOR 25 are, respectively, expanded in size to accommodate the required count (÷65 requires 7 bits of circuit). Counter 29, Divider 28 and XOR 30 are also respectively expanded to accommodate the required count (÷64 requires 6 bits of circuit).

No modification in the feedback loop comprised of Phase Detector 27, and Low Pass Filter 26 is required. The operation of the feedback loop is as previously set forth herein, except that the repetition rate on lines W1 and W2 is now 416 nanoseconds. The data input control lines into XOR 25 from ROM 31 now require seven lines. The data input control lines into XOR 30 now require six lines. The ROm 31 now require seven data output lines to accommodate XOR 25. The appropriate data will be stored in the ROM. The operation of the programmable electronic delay will be as explained earlier herein. When the data supplied to XOR 30 (6.5 nanosecond counter) is increased by 1 or more counts, the data output from the ROM, will supply the necessary data in the proper format to XOR 25 (6.4 nanosecond counter) to decrease by 1 or more counts respectively. The net result will be T delay ($P_{td}$) moving in increments of 100 ps relative to Reference Waveform $P_r$. Total delay range is from 0 to 415.9 nanoseconds, or 4160 programmable steps, each successive step being in increments of 100 pico seconds.

Applicants' invention may be practiced by constructing the apparatus shown in FIG. 2 by the interconnection of commercially available components. One source of suitable commercially available components is Motorola Semiconductor Products Inc. Two copyrighted publications by Motorola Inc, identified below, fully disclose a number of suitable components commercially available from Motorola that may be utilized to practice applicants' invention.

Motorola Publication No. 1: "MECL Integrated Circuits Data Book" By Motorola Semiconductor Products, Inc. Third Edition — Copyrighted by Motorola Inc. 1973. (All Rights Reserved)

Motorola Publication No. 2: "Phase-Lock Loop Systems Data Book" by Motorola Semiconductor Products Inc. Second Edition — Copyrighted by Motorola Inc. 1973 (All Rights Reserved)

NOTE: MECL, MECL III, MECL 10,000, MTTL, MTTL III and MDTL are trademarks of Motorola Inc. (MECL is the Motorola Emitter-Coupled Logic family).

Motorola Emitter Coupled Logic III (MECL III) is particularly suitable to practice applicants' invention. MECL III circuitry has fast switching speeds, short delays and is available commercially.

Figure 10:
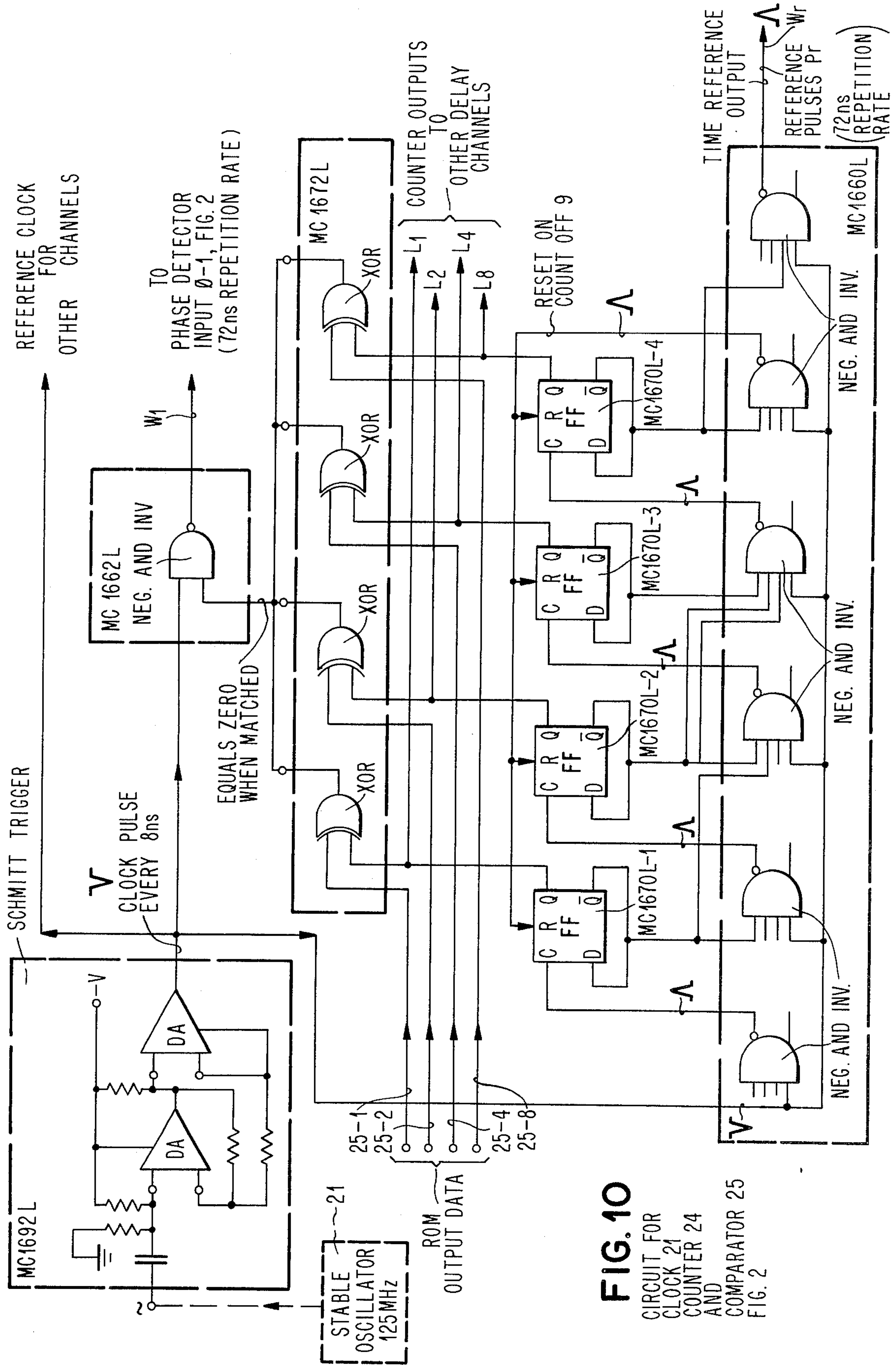
FIG. 10 discloses stable clock means, divider means, counter means and comparator means that may be employed to practice the invention.

The circuitry of FIG. 10 is a relatively detailed showing of the interconnected logical circuitry and interconnection of the clock 21, divider 23, counter 24 and comparator 25 of FIG. 2. As will be apparent from the description that follows, the circuitry of FIG. 2 may be substantially constructed from interconnected MECL components.

The Schmitt Trigger MC1692L may be constructed from an integrated circuit block. This block is commercially available from Motorola by the designation "Quad Line Receiver" MC1692L, a DIP pack (Dual In-line package) from Motorola Inc. MC1692L is a member of the MECL 111 MC1600 series and has four differential amplifiers each with emitter followers. As seen in FIG. 10, two of these differential amplifiers have been interconnected to form the Schmitt Trigger MC 1692L. The MC1692L integrated circuit block is disclosed and discussed on page 4–74 of the above-identified Motorola Publication No. 1.

The Negative Nand circuit contained within the broken line MC1662L (FIG. 10) may be one unit of a Quad 2-Input NOR Gate, MC1662L of the Motorola Series MECL 111 MC1600 Series. The integrated circuit block MC1662 has four 2-input NOR or NAND gating functions in a single package. The MC1662L integrated circuit block is disclosed and discussed on page 4–21 of the above-identified Motorola Publication No. 1.

The Exclusive OR Circuits contained within the broken line MC 1672L (FIG. 10) may be two integrated circuit blocks, namely, MC 1672L of the Motorola MECL III MC 1600 Series. The "Triple 2-Input Exclusive-OR Gate" MC1672L is disclosed and discussed on pages 4–47 of Motorola, Publication No. 1.

The four flip-flop circuits designated MC1670L-1, MC1670L-2, MC1670L-3 and MC1670L-4 may respectively be integrated circuit blocks entitled "Master-Slave Type D Flip-Flop" and designated as MC1670L in the Motorola MECL 111 MC1600 series. The MC1670L is disclosed and discussed on pages 4–39 of the Motorola Publication No. 1.

The Negative NAND circuits enclosed within broken line MC1660L (FIG. 10) may be constructed from integrated circuit blocks MC1660L entitled "Dual 4-Input Gate" of the MECL 111 MC1600 Series. The Dual 4-Input Gate MC1660L is disclosed and discussed on pages 4–17 of the Motorola Publication No. 1.

Referring to the Negative NAND circuits, enclosed within broken line MC1660L (FIG. 10) and specifically certain of the unconnected inputs thereof, the Motorola Publication No. 1, on page 4–17, shows the detailed circuit schematic for the Dual 4-Input Gate MC1660L and states in part as follows: "The input pulldown resistors eliminate the need to tie unused inputs to $V_{EE}$."

Figure 5:
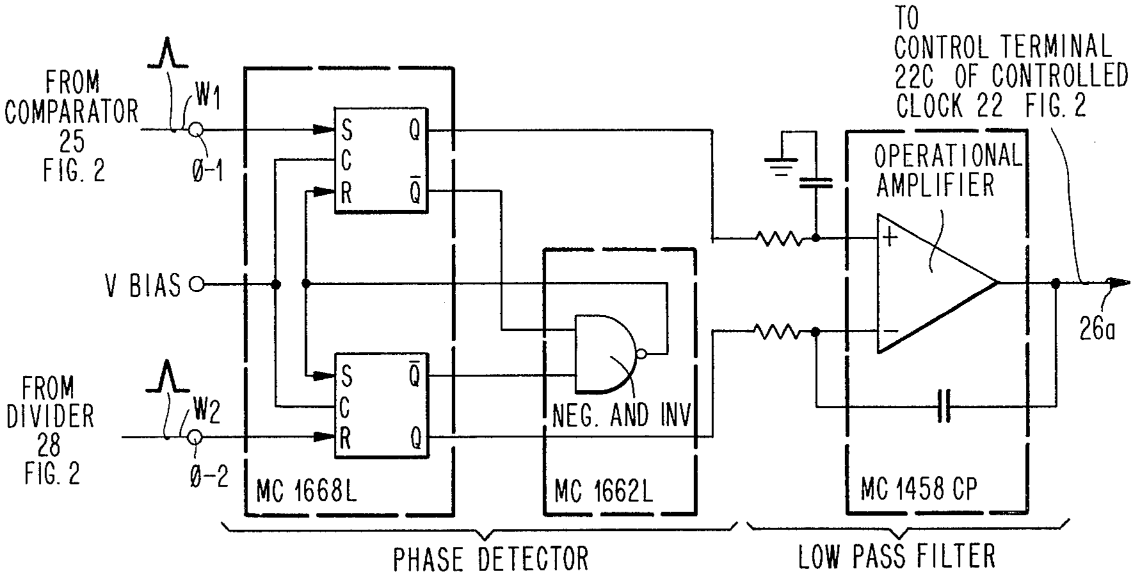
FIG. 5 is a circuit schematic representing a Phase Detector and Low Pass Filter that may be employed to practice the invention.

The logical block diagram shown in FIG. 5 discloses a phase detector and low pass filter that may be employed in the programmable delay of FIG. 2. In FIG. 5, the circuitry enclosed within broken line MC1668L may be constructed from an integrated circuit block MC1668L entitled "Dual clocked Latch" of the MECL 111 MC 1600 Series. The "Dual clocked Latch" MC1668L is disclosed and discussed on pages 4–34 of the Motorola Publication No. 1.

The Negative AND circuit enclosed within the broken line MC1662L may be an integrated circuit block MC1662 entitled "Quad 2-Input NOR Gate" of the MECL 111 MC1600 series. The Quad 2-Input NOR Gate MC1662L is disclosed and discussed on pages 4–21 of Motorola Publication No. 1.

The Low Pass Filter, FIG. 5, comprised of an operational Amplifier (enclosed broken line MC1458CP) may be constructed from an integrated circuit block MC1458CP entitled "High Performance Monolithic Operational Amplifier" MC1458CP. The integrated circuit MC1458CP is disclosed and discussed on pages 8–307 of the Motorola Publication entitled "Linear Integrated Circuits Data Book", Copyrighted 1973 by Motorola Inc.

Figure 6:
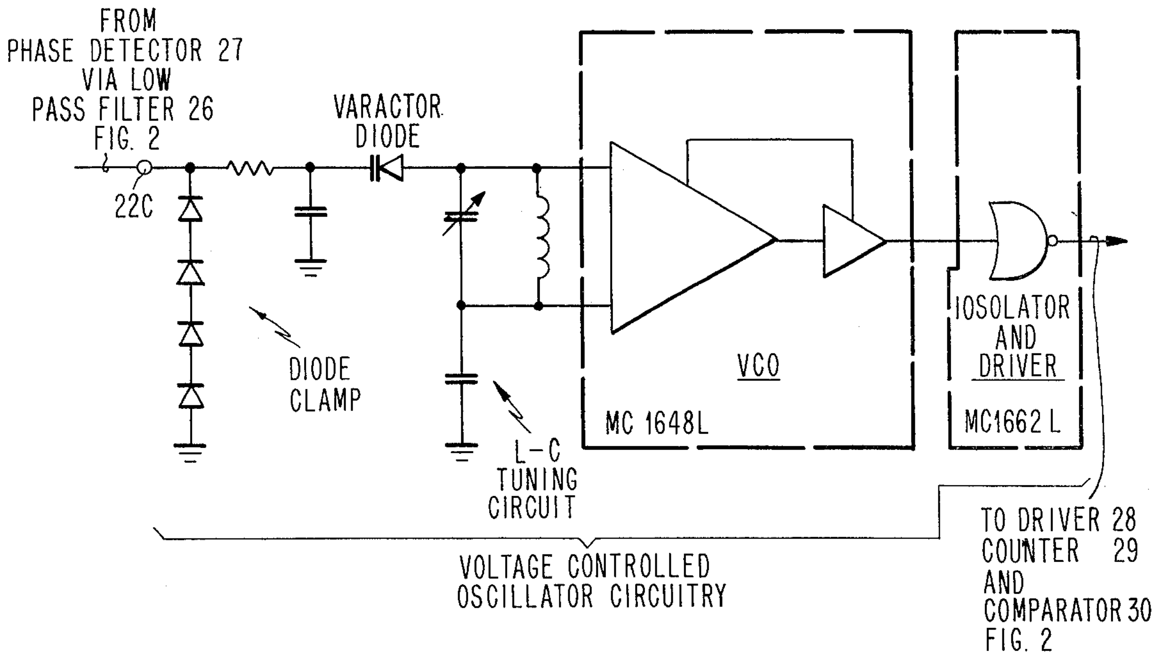
FIG. 6 discloses voltage controlled oscillator circuitry that may be employed to practice the invention.

Referring to FIG. 6, the circuitry enclosed by broken line MC1648L may be an integrated circuit block MC1648L entitled "Voltage Controlled Oscillator" MC1648L of the MECL 111 MC1600 Series. The Voltage Controlled Oscillator MC1648L is disclosed and discussed on pages 4–3 of Motorola Publication No. 1.

Still referring to FIG. 6, the isolator and driver circuitry, enclosed broken line MC1662L, may be constructed from an integrated circuit block MC1662L entitled Quad 2-Input NOR Gate of the MECL 111 MC1600 Series. The integrated circuit of MC1622L is disclosed and discussed on pages 4–21 of Motorola Publication No. 1.

Figure 8:
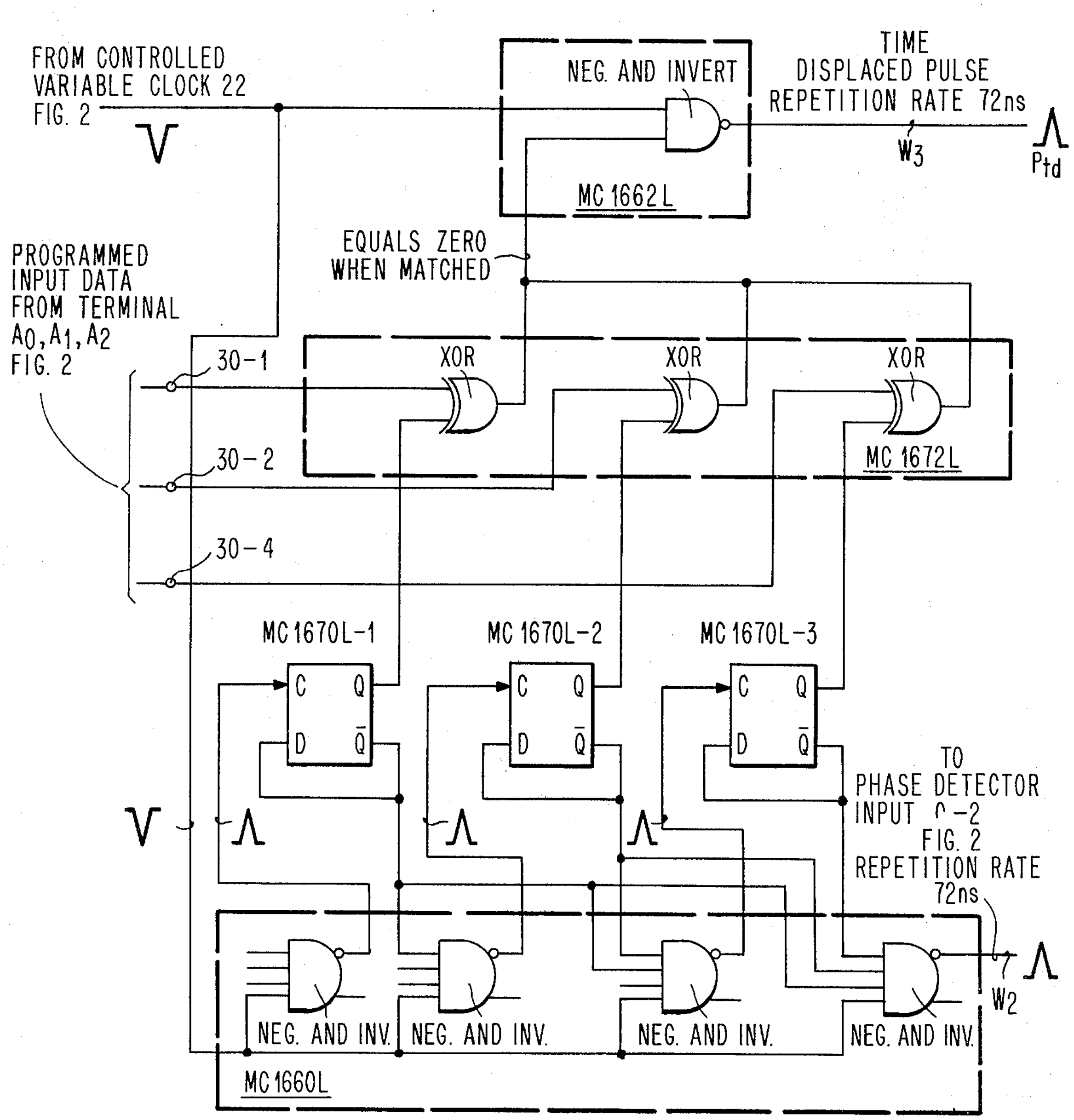
FIG. 8 discloses divider, counter and comparator circuitry that may be employed to practice the invention.
Figure 9:
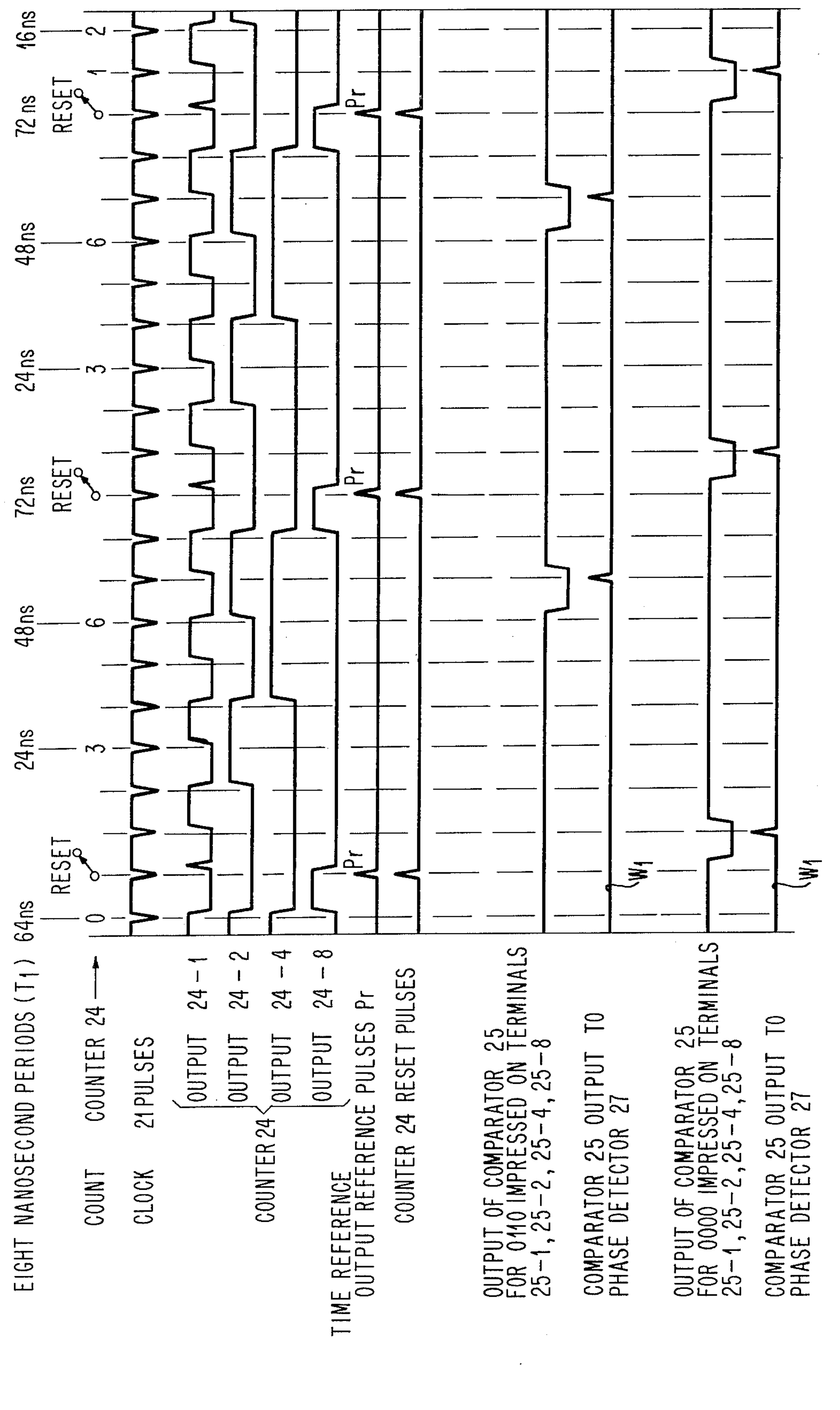
FIG. 9 discloses illustrative waveforms to be viewed in conjunction with the description of the operation of the invention.

The circuitry shown in detail in FIG. 8 may be employed as the Divider 28, counter 29, and comparator 30 of the programmable delay of FIG. 2. The Negative AND circuit enclosed within broken line MC1662L may be constructed from an integrated circuit block MC1662L entitled "Quad 2-Input NOR Gate" of the MECL III MC1600 Series. The integrated cicuit MC1662L is disclosed and discussed on pages 4–21 of Motorola Publication No. 1. The Exclusive OR circuits enclosed within broken line MC1672L may be constructed from an integrated circuit block MC1672L entitled "Triple 2-Input Exclusive-OR Gate" of the MECL III 1600 Series disclosed and discussed on pages 4–47 Motorola Publication No. 1. The three Flip-Flops MC1670L-1, MC1670L-2 and MC1670L-3 may be respectively constructed from integrated circuit blocks MC1670L entitled "Master-Slave Type D Flip-Flop" of the MECL MC1600 Series, disclosed and discussed on pages 4–39 of the Motorola Publication No. 1. The four Negative AND Circuits enclosed within broken line MC1660L may be constructed from integrated circuit blocks MC1660L entitled "Dual 4-Input Gate" of the MECL III 1600 Series, disclosed and discussed on pages 4–17 of Motorola Publication No. 1.

Figure 7:
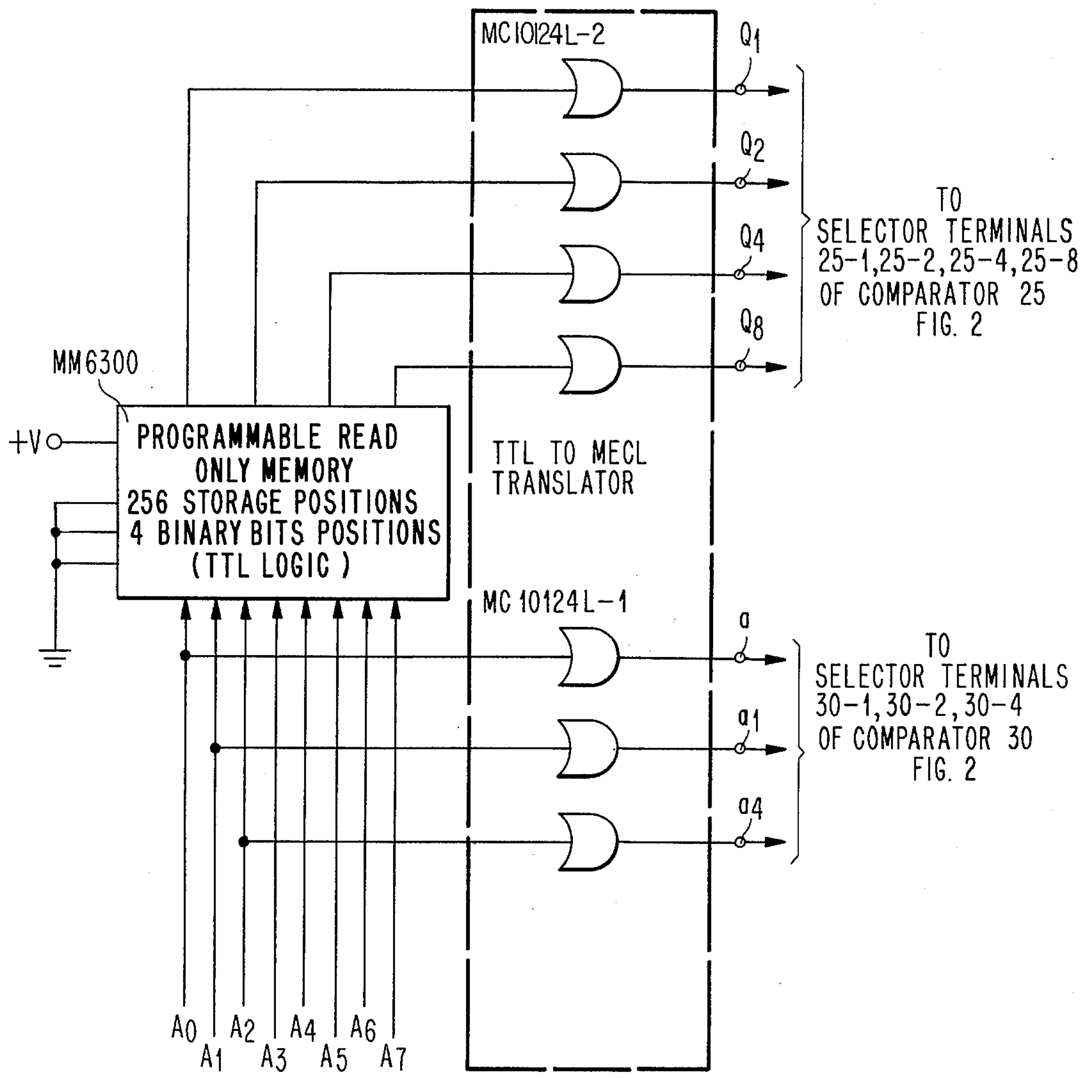
FIG. 7 discloses Read Only Memory (ROM) circuitry with TTL to MECL level conversion circuitry that may be employed to practice the invention.

Referring to FIG. 7, the ROM circuitry with TTL TO MECL level conversion is disclosed in detail. The Programmable Read Only Memory (ROM) MM6300 may be a 6300 Series ROM commercially available from Monolithic Memory Devices Inc. The TTL to MECL translator circuitry enclosed with broken lines MC10124L-1 and MC10124L-2 may be constructed from integrated circuit blocks MC10124L entitled "MTTL to MECL Translator of the MECL 10,000 Series" disclosed and discussed on pages 3–31 of Motorola Publication No. 1.

Applicants' have described in detail alternative embodiments of their invention in addition to the detailed description of the preferred embodiment of their invention. From the teaching of the invention contained herein, numerous modifications to the invention will be apparent to those skilled in the art, without departing from the practice of applicants' invention.

While this invention has been particularly described with reference to the preferred embodiments thereof, it will be understood by those skilled in the art that the foregoing and other changes in form and detail may be made without departing from the spirit and scope of the invention.

It is to be understood that the specific embodiments disclosed in the drawings and described above are merely illustrative of the many forms which the invention may take in practice and that numerous modifications thereof will readily occur to those skilled in the art without departing from the scope of the invention delineated in the appended claims which are to be construed as broadly as permitted by the prior art.

What is claimed is:

1. High resolution digitally programmable electronic apparatus for providing an accurately shaped and precisely timed first electrical pulse and an accurately shaped and precisely timed second electrical pulse, said electronic apparatus comprising:

a stable first oscillator providing a periodic output at a frequency of $f_1$ megahertz and a clock period of $T_1$ nanoseconds, where $f_1$ is a positive number greater than 100 and $T_1$ is equal to $1/f_1$;

a controllable second oscillator having a control input and providing a periodic output at a frequency of $f_2$ megahertz and a clock period of $T_2$ nanoseconds, where $T_2$ is equal to $1/f_2$, $Nf_2$ is equal to $Mf_1$, N and M are respectively positive integers and N is not equal to M;

phase detector means having first and second inputs and an output;

an M radix divider having its input connected to the output of said first oscillator and its output connected to said first input of said phase detector means;

an N radix divider having its input connected to the output of said second oscillator and its output connected to said second input of said phase detector means;

low pass filter means intercoupling said output of said phase detector means and said control input of said second oscillator;

first and second binary counters each having an input, and each having a plurality of outputs respectively designated as $2^0$, $2^1$, $2^2$, $2^3$- - $2^{n-1}$ and $2^n$;

binary word manifesting means for manifesting a binary word having bit positions respectively designated $2^0$, $2^1$, $2^2$, $2^3$ - - - - - - - $2^{n-1}$ and $2^n$;

first comparison means interconnecting said outputs of said first binary counter with said binary word manifesting means, said first comparison means having an output for providing said first electrical pulse when the binary count within said first counter is equal to the binary word manifested by said binary word manifesting means;

second comparison means interconnecting outputs of said second binary counter with said binary word manifesting means, said second comparison means having an output for providing said second electrical pulse when the binary count within said second counter is equal to the binary word manifested by said binary word manifesting means;

whereby the time duration in nanoseconds between the occurrence of said first electrical pulse and the occurrence of said second electrical pulse is precisely selected and determined by the magnitude of the binary word manifested by said binary word manifesting means.

2. A high resolution digitally programmable electronic delay for providing an accurately shaped and precisely timed reference pulse and an accurately shaped and precisely timed delay pulse, said electronic delay comprising:

a stable pulse generator providing a periodic output at a pulse repetition rate of $f_1$ megahertz and a clock period of $T_1$ nanoseconds, where $f_1$ is a positive number greater than 100 and $T_1$ is equal to $1/f_1$ nanoseconds;

a controllable second pulse generator having a control input and providing a periodic output at a pulse repetition rate of $f_2$ megahertz and a clock period of $T_2$, where $T_2$ is equal to $1/f_2, f_2$ is equal to $kf_1$, and $k$ is a positive constant having a magnitude of less than 2;

phase detector means having first and second inputs and an output;

a first divider circuit having its input connected to the output of said first pulse generator and its output connected to said first input of said phase detector means;

a second divider circuit having its input connected to the output of said second pulse generator and its output connected to said second input of said phase detector means;

means intercoupling said output of said phase detector means and said control input of said second pulse generator;

first and second binary counters each having an input and each having an output;

binary word manifesting means for manifesting a binary word;

first comparison means interconnecting said output of said first binary counter with said binary word manifesting means, said first comparison means having an output for providing said reference pulse when the binary count within said first counter is equal to said binary word manifested by said binary word manifesting means;

second comparison means interconnecting said output of said second binary counter with said binary word manifesting means, said second comparison means having an output for providing a said time delayed pulse when the binary count within said second counter is equal to said binary word manifested by said binary manifesting means;

whereby the time duration between said reference pulse and said time delayed pulse is precisely selected and determined by the magnitude of the binary word manifested by said binary word manifesting means.

3. A high resolution digitally programmable electronic delay for providing an accurately shaped and precisely timed output pulse a predetermined finite integer number of nanoseconds subsequent to a reference time, said electronic delay comprising:

first means for generating said time reference in the form of an electrical pulse;

second means for generating said output pulse a predetermined finite integer number of nanoseconds subsequent to said reference time;

synchronizing means interconnecting said first and second means for maintaining said second means in synchronism with said first means;

and digitally programmable means having input terminals for receiving an electrical manifestation of a digital word and interconnecting said first and second means, said digitally programmable means cooperating with, and controlling said first and second means, whereby the electrical manifestation of a digital word impressed on said input terminals of said digitally programmable means determines the predetermined finite integer number of nanoseconds between said reference time pulse and said accurately shaped and precisely timed output pulse.

4. Electronic apparatus for providing a first precisely timed pulse and a second precisely timed pulse, where said second pulse is caused to occur precisely 1, 2, 3, 4, 5, 6 or 7 nanoseconds subsequent in time to the rendition of said first pulse, said apparatus including:

a first pulse generator providing periodic pulses at a constant pulse repetition rate;

a second controllable pulse generator providing periodic pulses at a second controlled pulse repetition rate;

control means interconnecting said first and second pulse generators for maintaining a predetermined mathematical relationship between the pulse repetition rate of said second pulse generator and the pulse repetition rate of said first pulse generator;

digital means interconnecting said first and second pulse generators, said digital means, receiving first, second, third, fourth, fifth, sixth or seventh distinct digital words, said digital means including means for electrically manifesting said first precisely timed pulse and means for electrically manifesting said second precisely timed pulse, whereby, when said digital means receives said first digital word the time displacement between said first pulse and said second pulse is one nanosecond, when said digital means recieves said second digital word the time displacement between said first pulse and said second pulse is two nanoseconds, when said digital means receives said third digital word the time displacement between said first pulse and said second pulse is 3 nanoseconds, when said digital means receives said fourth digital word the time displacement between said first pulse and said second pulse is 4 nanoseconds, when said digital means receives said fifth digital word the time displacement between the first and second pulses is 5 nanoseconds, when said digital means receives said sixth digital word the time displacement between said first and second pulses is 6 nanoseconds, and when said digital means receives said seventh digital word the time displacement between said first and second pulses is 7 nanoseconds.

5. An electronic timer for accurately defining under control of a digital input 1, 2, 3, 4, 5, 6 or 7 nanosecond periods of elapsed time, said timer comprising:

first electronic means providing an output having an invariant time period;

second controllable electronic means providing an output having a time period bearing a predetermined fixed mathematical relationship to said invariant time period of said first electronic means;

control means intercoupling said first electronic means and said second electronic means, said control means being effective to establish and maintain said fixed mathematical relationship between said time period of said second electronic means and said invariant time period of said first electronic means;

digital means having digital input terminals and interconnecting said first and second electronic means, whereby the digital input applied to said digital input terminals of said digital means determines the elapsed time period defined by said electronic timer.

6. A high resolution digitally programmable electronic delay for providing an accurately shaped and precisely timed output electrical pulse, said electronic delay comprising:

a stable first oscillator providing a periodic output at a frequency of $f_1$ megahertz and a clock period of $T_1$ nanoseconds, where $f_1$ is a positive number greater than 100 and $T_1$ is equal to $1/f_1$ nanoseconds;

a controllable second oscillator having a control input and providing a periodic output at a frequency of $f_2$ megahertz and a clock period of $T_2$, where $T_2$ is equal to $1/f_2$ and $9f_2 = 8f_1$;

phase detector means having first and second inputs and an output;

an 8 radix divider having its input connected to the output of said first oscillator and its output connected to said first input of said phase detector means;

a 9 radix divider having its input connected to the output of said second oscillator and its output connected to said second input of said phase detector means;

low pass filter means intercoupling said output of said phase detector means and said control input of said second oscillator;

first and second binary bit counters, said first counter having a radix of 8, said second counter having a radix of 9, each of said counters having an input, and each of said counters having outputs respectively designated as the $2^0$, $2^1$ and $2^2$;

binary word manifesting means for manifesting a binary word having bit positions respectively designated $2^0$, $2^1$ and $2^2$;

first comparison means interconnecting said $2^0$, $2^1$ and $2^2$ outputs of said first binary counter with said binary word manifesting means, said first comparison means having an output for providing a first electrical pulse when the binary count within said first counter is equal to the binary word manifested by said binary word manifesting means;

second comparison means interconnecting said $2^0$, $2^1$ and $2^2$ outputs of said second binary counter with said binary word manifesting means, said second comparison means having an output for providing a second electrical pulse when the binary count within said second counter is equal to said binary word manifested by said binary word manifesting means;

whereby the time duration in nanoseconds, between said first electrical pulse and said second electrical pulse is precisely selected and determined by the magnitude of the binary word manifested by said binary word manifesting means.

7. Electronic apparatus for providing a first pulse train wherein the time interval between successive pulses of said first pulse train is consistently a precise integer number of nanoseconds, and a second pulse train wherein the time interval between successive pulses of said second pulse train is consistently a precise integer number of nanoseconds, and wherein each pulse of said second pulse train is displaced in time from a pulse of said first pulse train a predetermined integer number of nanoseconds, said electronic apparatus comprising:

first stable pulse generator means for providing said first pulse train;

second controllable pulse generator means for providing said second pulse train;

and digital means receiving a digital input, said digital means interconnecting said first pulse generator means and said second pulse generator means, said digital means including control means for controlling said second pulse generator means, said control means being responsive to a digital input received by said digital means to determine said predetermined integer number of nanoseconds that each pulse of said second pulse train is displaced in time from a pulse in said first pulse train.

8. High speed precision electronic apparatus for providing a first pulse at a predetermined time and a second pulse displaced in time from said first pulse any predetermined integer number of nanoseconds, and where said predetermined integer number of nanoseconds is less than 100 nanoseconds, said apparatus comprising:

a first stable oscillator providing an output at an invariant frequency;

a second controllable oscillator providing an output at a controlled frequency;

first digital circuit means coupled to said first oscillator and providing said first pulse, said first digital circuit means receiving a digital input and providing a digital output at a time related to the digital input received by said first digital circuit means;

second digital circuit means coupled to said second controllable oscillator and to said first digital circuit means, said second digital circuit means being responsive to said digital output of said first digital circuit means for controlling said second controllable oscillator, said second digital circuit means receiving a digital input and providing said second pulse at a time related to the digital input received by said second digital circuit means;

whereby the integer number of nanoseconds that said second pulse is subsequent in time to said first pulse is absolutely determined by the magnitude of the digital input received by said first digital circuit means and the magnitude of the digital input received by said second digital circuit means.

9. Electronic apparatus for providing a first pulse train having a constant pulse repetition, a second pulse train having a pluse repetition rate euqal to the pulse repetition rate of said first pulse train and where said second pulse train is displaced a controllable integer number of nanoseconds from said first pulse train, said electronic apparatus comprising:

first circuit means for providing said first pulse train having a constant repetition rate;

second circuit means cooperating with said first circuit means for providing said second pulse train;

third circuit means interconnecting said first and second circuit means, said third circuit means including digital control means receiving a digital input for controlling and determining the integer number of nanseconds said second pulse train is displaced from said first pulse train.

10. A high resolution digitally programmable delay circuit for providing a time displaced pulse a precise integer number of elapsed equal time increments with respect to a reference pulse occurring periodically at a precise reference time, where said integer number is any integer from one through one hundred and each said elapsed time increment is of equal duration, and equal to or less than 1 nanosecond, said high resolution digitally programmable delay comprising:

a first pulse source for providing output pulses at a constant pulse repetition rate;

a first circuit coupled to said first pulse source for providing said periodically occurring reference time pulses;

a first pulse counter coupled to said first pulse source, said first pulse counter having a first radix, said first pulse counter having an output manifesting the count contained therein in response to each of said pulses from said first pulse source;

a first comparator coupled to said output of said first pulse counter, said first comparator having digital input terminals and an output terminal, said first comparator providing an output when the count contained within said first counter is equal to the digital value impressed on said digital input terminals of said first comparator;

a second pulse source for providing output pulses at a controllable pulse repetition rate, said second pulse source having a control input terminal adapted to receive an input for controlling the pulse repetition rate of said second pulse source;

a second circuit coupled to said second pulse source and having an output terminal for providing an output having a fixed mathematical relationsip to said pulse repetition rate of said second source;

control means intercoupling said control input terminal of said second pulse source, said output terminal of said first comparator and said output terminal of said second circuit, said control means providing said control input for controlling said pulse repetition rate of said second pulse source;

a second pulse counter coupled to said second pulse source, said second pulse counter having a second radix, said second pulse counter having an output manifesting the count contained therein in response to each of said pulses from said second pulse source;

a second comparator coupled to said output of said second pulse counter, said second comparator having digital input terminals and an output terminal, said second comparator being providing a time displaced pulse when the count contained within said second counter is equal to the digital value impressed on said digital input terminals of said second comparator, whereby said digital value impressed on said digital input terminals of said first comparator and said digital value impressed on said digital input terminals of said second comparator determine the precise integer number of elapsed time increments between said reference time pulses and said time displaced pulses, and the magnitude of an elapsed time increment is mathematically related to the pulse repetition rates of said first and second pulse sources.

11. In a high resolution digitally programmable delay circuit for providing a time displaced pulse a precise integer number of elapsed equal time increments with respect to a reference pulse occurring periodically at a precise reference time, as recited in claim 10, where said first pulse source has a clock period of $T_1$ nanoseconds, said second pulse source has a clock period of $T_2$ nanoseconds, $T_2$ is greater in magnitude than $T_1$, and said equal time increments are respectively $T_2—T_1$ nansecond in duration.

12. In a high resolution digitally programmable delay circuit for providing a time displaced pulse a precise integer number of elapsed equal time increments with respect to a reference pulse occurring periodically at a precise reference time, as recited in claim 10, where said first pulse source has a clock period of $T_1$ pico seconds, said second pulse source has a clock period of $T_2$ pico seconds, $T_2$ is greater in magnitude than $T_1$, said equal time increments are respectively $T_2—T_1$ pico seconds, and said equal time increments are respectively 100 pico seconds in duration.

13. In a high resolution digitally programmable delay circuit for providing a time displaced pulse a precise integer number of elapsed equal time increments with respect to a reference pulse occurring periodically at a precise reference time, as recited in claim 11, further characterized in that said digital value impressed on said digital input terminals of said first comparator and said digital value impressed on said digital input terminals of said second comparator are respectively provided by a unitary means in response to a single digital input thereto.

14. In a high resolution digitally programmable delay circuit for providing a time displaced pulse a precise integer number of elapsed equal time increments with respect to a reference pulse occurring periodically at a precise reference time, as recited in claim 13, further characterized in that said first radix of said first counter is larger than said second radix of said second counter, whereby when said digital value impressed on said digital input terminals of said first comparator is decreased in unison with an increase of said digital value impressed on said digital input terminals of said second comparator said precise integer number of elapsed equal time increments is increased.

15. In a high resolution digitally programmable delay circuit for providing a time displaced pulse a precise integer number of elapsed equal time increments with respect to a reference pulse occurring periodically at a precise reference time, as recited in claim 11, where said equal time increments as determined by $T_2-T_1$ are respectively equal to or less than one-half of a nanosecond in duration.

16. In a high resolution digitally programmable delay circuit for providing a time displaced pulse a precise integer number of elapsed equal time increments with respect to a reference pulse occurring periodically at a precise reference time, as recited in claim 11, where said equal time increments as determined by $T_2-T_1$ are respectively greater than one-half of a nanosecond and less than 1 nanosecond in duration.

17. In a high resolution digitally programmable delay circuit for providing a time displaced pulse a precise integer number of elapsed equal time increments with respect to a reference pulse occurring periodically at a precise reference time, as recited in claim 10, where the digital values impressed on said digital input terminals of said first comparator, the digital values impressed on said digital input terminals of said second comparator, and said integer number of elapsed time increments are in accordance with the following tabulation:

| Digital Value Impressed On Digital Input Terminals Of Said First Comparator | Digital Value Impressed On Digital Input Terminal Of Said Second Comparator | Integer Number Of Elapsed Time Increments |
|---|---|---|
| 0 | 0 | 0 |
| 8 | 1 | 1 |
| 7 | 2 | 2 |
| 6 | 3 | 3 |
| 5 | 4 | 4 |
| 4 | 5 | 5 |
| 3 | 6 | 6 |
| 2 | 7 | 7 |
| 1 | 0 | 8 |
| 0 | 1 | 9 |
| 8 | 2 | 10 |
| 7 | 3 | 11 |
| 6 | 4 | 12 |
| 5 | 5 | 13 |
| 4 | 6 | 14 |
| 3 | 7 | 15 |
| 2 | 0 | 16 |
| 1 | 1 | 17 |
| 0 | 2 | 18 |
| 8 | 3 | 19 |
| 0 | 7 | 63 |
| 8 | 0 | 64 |
| 7 | 1 | 65 |
| 6 | 2 | 66 |
| 5 | 3 | 67 |
| 4 | 4 | 68 |
| 3 | 5 | 69 |
| 2 | 6 | 70 |
| 1 | 7 | 71 |

18. In a high resolution digitally programmable delay circuit for providing a time displaced pulse a precise integer number of elapsed equal time increments with respect to a reference pulse occurring periodically at a precise reference time, as recited in claim 11, where said equal time increments as determined by $T_2-T_1$ are respectively equal to, or less than 100 pico seconds in duration.

19. In high speed precision electronic apparatus for providing a first pulse at a predetermined time and a second pulse displaced in time from said first pulse any predetermined integer number of nanoseconds, as recited in claim 8, where said any predetermined integer number of nanoseconds has a range of 0 through 144.

* * * * *